United States Patent [19]

Nishimae et al.

[11] Patent Number: 4,890,294
[45] Date of Patent: Dec. 26, 1989

[54] PLASMA APPARATUS

[75] Inventors: Junichi Nishimae; Kenji Yoshizawa; Masakazu Taki; Yoshihiro Ueda; Tadashi Yanagi; Akihiko Iwata, all of Hyogo, Japan

[73] Assignee: Mitsubishi Denki Kabushiki Kaisha, Tokyo, Japan

[21] Appl. No.: 147,726

[22] Filed: Jan. 25, 1988

[30] Foreign Application Priority Data

| Jan. 26, 1987 | [JP] | Japan | 62-15690 |
| Jan. 28, 1987 | [JP] | Japan | 62-18071 |
| Aug. 6, 1987 | [JP] | Japan | 62-195185 |
| Sep. 10, 1987 | [JP] | Japan | 62-225202 |
| Sep. 10, 1987 | [JP] | Japan | 62-225205 |
| Sep. 10, 1987 | [JP] | Japan | 62-225206 |
| Sep. 10, 1987 | [JP] | Japan | 225208 |
| Sep. 10, 1987 | [JP] | Japan | 225209 |
| Sep. 10, 1987 | [JP] | Japan | 62-225211 |
| Sep. 10, 1987 | [JP] | Japan | 62-225214 |
| Sep. 10, 1987 | [JP] | Japan | 62-225215 |
| Sep. 10, 1987 | [JP] | Japan | 62-225219 |
| Sep. 10, 1987 | [JP] | Japan | 62-225220 |
| Sep. 10, 1987 | [JP] | Japan | 62-225221 |
| Sep. 10, 1987 | [JP] | Japan | 62-225222 |
| Sep. 10, 1987 | [JP] | Japan | 62-225222 |

[51] Int. Cl.$^4$ ............................................. H01S 3/22
[52] U.S. Cl. ........................................ 372/57; 372/59; 372/61; 372/64; 372/76; 372/81; 372/82; 372/83
[58] Field of Search ............... 372/64, 85, 61, 70, 372/76, 81–83, 59, 33, 35

[56] References Cited

U.S. PATENT DOCUMENTS

| 3,602,837 | 8/1971 | Goldsborough | 372/35 |
| 4,169,251 | 9/1979 | Laakmann | 331/94.5 G |
| 4,429,398 | 1/1984 | Chenausky et al. | 372/64 |
| 4,455,658 | 6/1984 | Sutter Jr. | 372/82 |
| 4,494,236 | 1/1985 | Sutter Jr. | 372/64 |
| 4,577,323 | 3/1986 | Newman et al. | 372/64 |
| 4,703,489 | 10/1987 | Ross | 372/35 |
| 4,719,640 | 1/1988 | Chenausky et al. | 372/64 |
| 4,751,715 | 6/1988 | Henderson | 372/64 |

OTHER PUBLICATIONS

Handy et al., "Laser Generation by Pulsed 2.45 Ghz Microwave Excitation of $CO_2$", Applied Physics, vol. 49, No. 7, Jul. 1978, pp. 3753–3756.
Wisoff et al., "Improved Performance of the Microwave-Pumped XeCl Laser", IEEE Journal of Quantum Electronics, vol. QE-18, No. 11, Nov. 1982, pp. 1839 and 1840.
Smith et al., "Waveguide Tea Laser"; Appl. Phys. Lett., vol. 23, No. 9,; 1 Nov. 1973; pp. 524–526.
Adam et al., "Transversely Excited—Waveguide Laser"; Appl. Phys., vol. 8, No. 4; 12/1975; pp. 281–291.
Gibson et al..; "a Transversely Excited—Waveguide Laser"; appl. Phys. Lett., vol. 31, No. 3; 1 Aug. 1977; pp. 176–178.

Primary Examiner—Frank Gonzalez
Attorney, Agent, or Firm—Bernard, Rothwell & Brown

[57] ABSTRACT

The invention relates to a plasma apparatus where plasma is generated utilizing microwave discharge and laser excitation is performed and plasma processing is performed. More specifically, in a plasma apparatus where a microwave from a microwave oscillator is transmitted through a microwave transmission path to a microwave circuit, and plasma is generated by a microwave discharge within the microwave circuit, a plasma generating medium for generating the plasma is filled in a space formed between a conductor wall constituting a part of the microwave circuit and a dielectric installed opposite to the conductor wall, and the microwave circuit forms microwave mode having an electric field component orthogonal to the boundary between the dielectric and the plasma.

49 Claims, 28 Drawing Sheets

FIG. 11
(a)
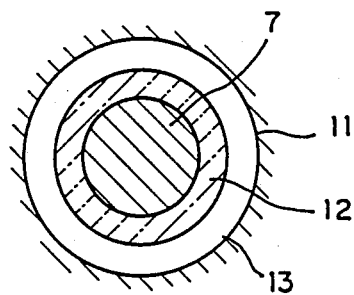
(b)
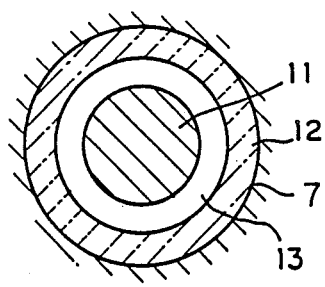
(c)
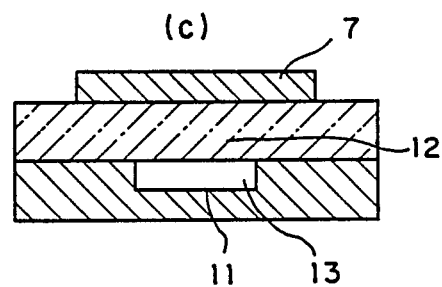

(a)

(b)

(a)

(b)

FIG. 21
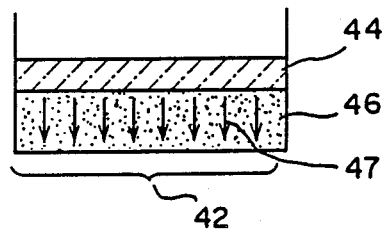
(a)
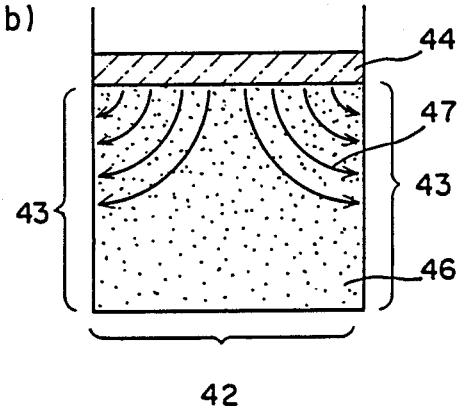
(b)
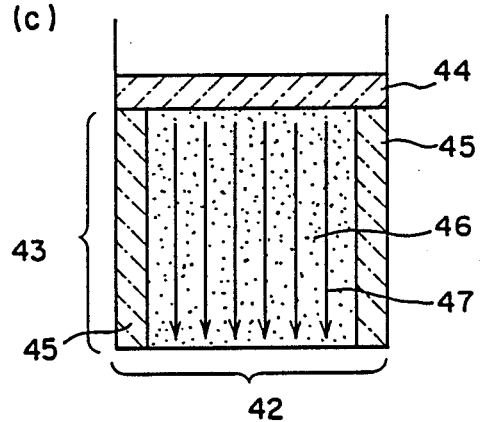
(c)

PLASMA APPARATUS

BACKGROUND OF THE INVENTION

1. Field of the Invention

The present invention relates to a plasma apparatus which generates plasma utilizing microwave discharge and performs laser excitation and can be utilized in plasma processing.

2. Description of the Prior Art

In the prior art, there are various plasma apparatuses utilizing microwave discharge, such as a laser apparatus, a light source apparatus, a plasma processing apparatus, an ion source or the like.

FIG. 1 is a sectional view of a gas laser apparatus in the prior art disclosed, for example, in Journal of Applied Physics, vol. 49, No. 7, July 1978, p. 3753, and FIG. 2 is a sectional view taken in line 2—2 in FIG. 1. In the figures, numeral 300 designates a waveguide for transmitting microwave, numeral 301 designates a waveguide taper provided on a portion of the waveguide 300, numeral 302 designates a laser discharge tube of Pyrex glass installed in a space of the waveguide taper, numeral 303 designates a laser gas inlet port provided on an end of the laser discharge tube 302, numeral 304 designates a laser gas outlet port provided also on an end of the laser discharge tube 302, numeral 305 designates a cooling gas feed tube installed to surround the laser discharge tube 302, numeral 306 designates a cooling gas inlet port provided on an end of the cooling gas feed tube 305, numeral 307 designates a cooling gas outlet port provided also on an end of the cooling gas feed tube 305, numeral 308 designates Brewster windows installed on both ends of the laser discharge tube 302, numeral 309 designates a cathode for DC discharge, and numeral 310 designates an anode also for DC discharge.

In the gas laser apparatus of the prior art as above described, a laser gas such as $CO_2$ laser gas is introduced from the laser gas inlet port 303 into the laser discharge tube 302, and on the other hand microwave of TE1O mode is excited in the waveguide 300. Since the waveguide 300 has the waveguide taper 301 on the inside and the inner diameter of the waveguide 300 becomes minimum at the installation position of the laser discharge tube 302, the electric field intensity of the microwave becomes maximum in this position. The strong microwave field causes discharge breakdown of the laser gas within the laser discharge tube 302 and generates plasma and excites the laser medium. Then $N_2$ gas of low temperature for example flows in the cooling gas feed tube 305 at high speed and the laser discharge tube 302 is cooled from outside and the discharge condition such as pressure of the laser gas is suitably selected whereby the laser oscillation condition is obtained, and further mirrors for laser oscillation (not shown) are installed on the outside of the Brewster windows 308 whereby the laser oscillation is performed.

In the gas laser apparatus of the prior art as above described, since the closed laser discharge tube 302 is used, if plasma with conductive property is generated, microwave mode of coaxial mode using plasma in the laser discharge tube 302 as the inner conductor becomes predominant and the microwave field in the plasma becomes electric field which component parallel to the tube wall of the discharge tube 302 is the main component, whereby microwave mode entering the plasma substantially perpendicular becomes to the tube wall of the laser discharge tube 302, i.e., the plasma boundary. In such discharge produced by the microwave being incident perpendicularly to the plasma boundary, the microwave field is decreased from the discharge tube wall towards inside, but since the discharge plasma has constant-voltage characteristics, the current density varies significantly depending on slight variation of the electric field. As a result, the plasma is generated and centered upon position near the discharge tube wall and becomes significantly uneven. This state is shown in a sectional view of FIG. 3. In FIG. 3, numeral 311 designates electric line of force of the microwave electric field, and numeral 312 designates plasma. In a gas laser apparatus utilizing microwave discharge in the prior art, since uneven plasma as shown in FIG. 3 is generated, it is difficult to make discharge as a whole suitable for the laser excitation. Moreover, the laser resonator mode and the plasma are not overlapped with each other and the laser output or efficiency becomes low.

In fact, in the apparatus of the prior art shown in FIG. 2, when microwave is 2.45 GHz and pulse microwave of 132 Hz is used and the apparatus is operated at pulse width 1 $\mu$s and peak power 2.6 kw, mean output of only 15 mw is obtained. This is because the apparatus can be operated only at pulse width 1 $\mu$s, 132 Hz, i.e., at very low pulse duty being about 1/10,000 due to unevenness of discharge as above described. Moreover, since the apparatus is operated at such slow repetition as 132 Hz, the plasma becomes uneven in aspect of time and therefore only laser oscillation by pulse can be performed. Such problems are produced not only in the gas laser apparatus, but various problems are produced also in other plasma apparatuses due to unevenness of discharge.

Also in the prior art, there is an optical waveguide type gas laser apparatus where laser gas is filled in a space acting as a light waveguide path to guide generated laser rays, and plasma is generated in the laser gas by discharge so as to perform laser excitation.

FIG. 4 is a sectional view of a optical waveguide type gas laser apparatus in the prior art disclosed, for example, in Japanese patent application laid-open No. 54-103692, and FIG. 5 is a sectional view taken line 5—5 in FIG. 4. In the figures, numerals 321, 322 designate a pair of long dielectrics opposite to each other, numerals 323, 324 designate a pair of long electrodes opposite to each other between these dielectrics 321, 322 with a prescribed spacing, numeral 325 designates a discharge space where all sides are defined by these dielectrics 321, 322 and electrodes 323, 324 and laser gas is filled therein so as to perform laser excitation by discharge, numeral 326 designates a block of material with high thermal conductivity, on which these dielectrics 321, 322 and electrodes 323, 324 are installed, numeral 327 designates a total reflection mirror arranged on one end of the discharge space 325, numeral 328 designates a partial transmission mirror arranged on other end of the discharge space 325 in opposition to the total reflection mirror 327, and numeral 329 designates a high-frequency voltage source for applying high-frequency electric field to the electrodes 323, 324. In this case, the discharge space 325 has dimensions suitable to guide the generated laser rays, and acts also as a light waveguide path.

Next, operation will be described. Laser gas is introduced into the discharge space 325, and high-frequency voltage is supplied between the electrodes 323 and 324 from the high-frequency voltage source 329. Thereby the strong high-frequency electric field is applied to the laser gas in the discharge space 325, and the discharge breakdown of the laser gas is produced by the high-frequency electric field and plasma is generated and the laser excitation is performed. The generated laser rays pass through the discharge space 325 as light waveguide path and are reflected between the total reflection mirror 327 and the partial transmission mirror 328 arranged on both ends of the discharge space 325, and a part of the laser rays is taken to the outside by the partial transmission mirror 328.

Since the optical waveguide type gas laser apparatus in the prior art is constituted as above described, it is difficult to make the frequency of the high-frequency voltage applied between the electrodes 323 and 324 high enough. Moreover, as the frequency of the high-frequency voltage is increased, the discharge in the discharge space 325 is concentrated toward surface portion of the dielectrics 321, 322 arranged on both sides of the discharge space 325, thereby uniform plasma cannot be obtained and it is difficult to make the discharge space 325 as a whole suitable for the laser excitation.

In any of the gas laser apparatuses in the prior art as above described, since the laser discharge tube as a whole is made of Pyrex glass, heat generated within the laser discharge tube cannot be radiated efficiently and the temperature rise of the laser gas such as $CO_2$ gas causes decrease of the laser output.

SUMMARY OF THE INVENTION

A first object of the present invention is to provide a plasma apparatus wherein plasma which is uniform in space and stable is generated, and laser operation of high efficiency and large output is made possible, and further filling of the plasma generating medium is simple.

A second object of the present invention is to provide a plasma apparatus of high efficiency and long life, wherein a wall surface of a discharge space is protected, and deterioration of a plasma generating medium is prevented.

A third object of the present invention is to provide a plasma apparatus of large diameter, wherein uniform discharge is obtained even at a discharge space of large area.

A fourth object of the present invention is to provide a plasma apparatus wherein microwave discharge plasma becomes uniform in space even in an optical waveguide type gas laser apparatus.

A fifth object of the present invention is to provide a plasma apparatus wherein generated microwave discharge plasma is made uniform in space, and cooling efficiency of a discharge tube is improved, and further laser operation of high efficiency and large output is possible.

A sixth object of the present invention is to provide a plasma apparatus wherein leakage of a plasma generating medium filled in a discharge space can be prevented.

A seventh object of the present invention is to provide a power source apparatus of small size, which can be used as a power source of a plasma apparatus and does not require a high-voltage power source for pulse control.

In order to attain the foregoing objects, in a plasma apparatus according to the present invention, a plasma generating medium to generate plasma by microwave discharge is filled in a space formed between a conductor wall to constitute a part of a microwave circuit such as a waveguide and dielectrics installed opposite to the conductor wall, and the microwave circuit forms microwave mode having vertical electric field component at the boundary between the dielectrics and the plasma.

Consequently, in the plasma apparatus according to the invention, since the conductor wall having higher conductivity than that of the plasma exists in opposition to dielectrics as a microwave incident window, the end current of the incident microwave flows through the conductor wall; thereby current penetrating between the dielectrics and the conductor wall flows in the plasma so as to generate plasma which is uniform in space.

A plasma apparatus according to the present invention also generates plasma by microwave discharge in pulse microwave. Thereby the plasma becomes further uniform in space.

In a plasma apparatus according to the present invention, microwave excited in a microwave circuit is made pulse microwave where quiescent time is shorter than the thermal time constant of a plasma generating medium, for example, $CO_2$ laser gas. Consequently, in the plasma apparatus of this invention, the plasma can also be made uniform in time.

In a plasma apparatus according to the present invention, a conductor wall surface constituting the space is coated with a ceramic layer so as to protect the wall surface; thereby deterioration of a plasma generating medium is prevented and plasma discharge at high efficiency and long life becomes possible.

In a plasma apparatus according to the present invention, a reservoir tank communicating with the space is installed to store a plasma generating medium, thereby a compact plasma apparatus with high efficiency, large output and long life can be obtained.

In a plasma apparatus according to the present invention, first and second dielectrics are arranged to a bottom surface and a side surface of the space constituted by the conductor wall; thereby plasma with high uniformity can be generated even in a discharge space of large area.

In an optical waveguide type gas laser apparatus in plasma apparatuses according to the present invention, a space as a light waveguide path is formed by a conductor wall constituting a part of a microwave circuit and dielectrics installed opposite to the conductor wall, and a laser gas as a plasma generating medium is filled in the space, and further microwave is incident thereto using the dielectrics as a microwave incident wall; thereby microwave mode having a vertical electric field component is formed at the boundary between the dielectrics and the plasma generated in the laser gas.

Consequently, in the optical waveguide type gas laser apparatus in plasma apparatuses according to the present invention, high-frequency voltage is not applied between two electrodes, but microwave is incident thereto using the dielectrics as a microwave incident window; thereby laser excitation by microwave becomes possible. Furthermore, since a conductor wall having higher conductivity than that of the plasma exists in opposition to the dielectrics to which the microwave is incident, the end current of the incident microwave flows through the conductor wall; thereby current penetrating between the dielectrics and the conductor wall flows in the plasma so as to generate a plasma which is uniform in space.

In a plasma apparatus according to the present invention, among a space formed between a conductor wall and dielectrics for filling a plasma generating medium therein, a portion other than the dielectrics of the space is partially formed by a gas permeable member, and circulation means for circulating the plasma generating medium within the space is installed through the gas permeable member. Thereby uniform plasma is generated in the plasma generating medium. Futhermore, since the laser gas within the space is circulated through the gas permeable member to reflect microwave, heat generated in the laser gas is radiated efficiently and the temperature rise of the laser gas is prevented.

In a plasma apparatus according to the present invention, the dielectrics and a part of a microwave formed by the conductor wall are bonded and sealed by an epoxy adhesive agent or metal seal such as brazing. Consequently, the plasma generating medium filled in the discharge space is prevented from leakage, and stable laser oscillation becomes possible.

In a plasma apparatus according to the present invention, a metallized layer is provided on a surface of the dielectrics opposite to the discharge space, and other surface of the metallized layer faces directly to a cooling water path. Consequently, cooling water in the cooling water path installed in a ridge is contacted directly with the metallized layer provided on the dielectrics; thereby heat generated in a laser gas such as $CO_2$ gas is removed efficiently and the temperature rise of the laser gas such as $CO_2$ gas is prevented.

In a plasma apparatus according to the present invention, an opening frame of a groove to constitute a discharge space is formed not in an edge-shaped surface but in an arc-shaped surface; thereby concentration of the electric field to the opening frame can be prevented and hence generation of uneven plasma in the discharge space can be prevented more effectively.

In a plasma apparatus according to the present invention, a metallized layer is provided on the dielectrics near a position corresponding to the opening edge portion of the groove to constitute the discharge space, and the metallized layer shields the electric field of microwave and prevents concentration of the electric field in the opening edge portion so that plasma which is uniform in space can be generated stably.

In a plasma apparatus according to the present invention, the microwave transmission path and the microwave circuit are arranged in parallel along the laser optical axis, thereby discharge length which is sufficient to increase laser output and uniform can be secured, and the apparatus as a whole is made compact, and further space factors and control characteristics can be significantly improved in comparison to the prior art.

The foregoing and other objects and advantages of the invention will be apparent from the following detailed description taken in connection with the accompanying drawings.

BRIEF DESCRIPTION OF THE DRAWINGS

FIGS. 11(a)–11(c) are diagrams illustrating another embodiment of a microwave circuit;

FIGS. 21(b)–21(c) are diagrams illustrating state of discharge in the fifth embodiment;

DETAILED DESCRIPTION OF THE PREFERRED EMBODIMENTS

Figure 6:
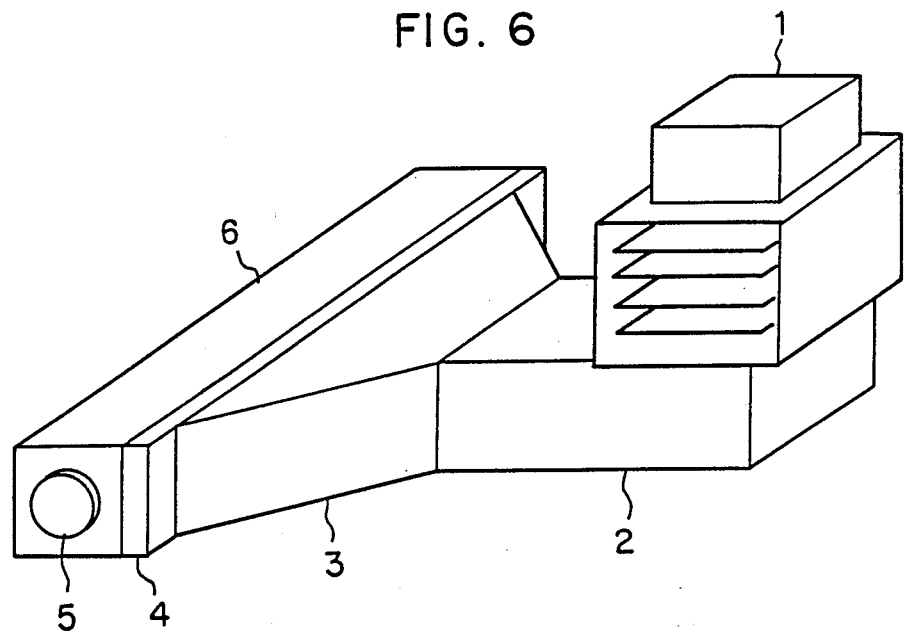
FIG. 6 is a view showing the appearance of a gas laser apparatus as a first embodiment of the present invention.
Figure 7:
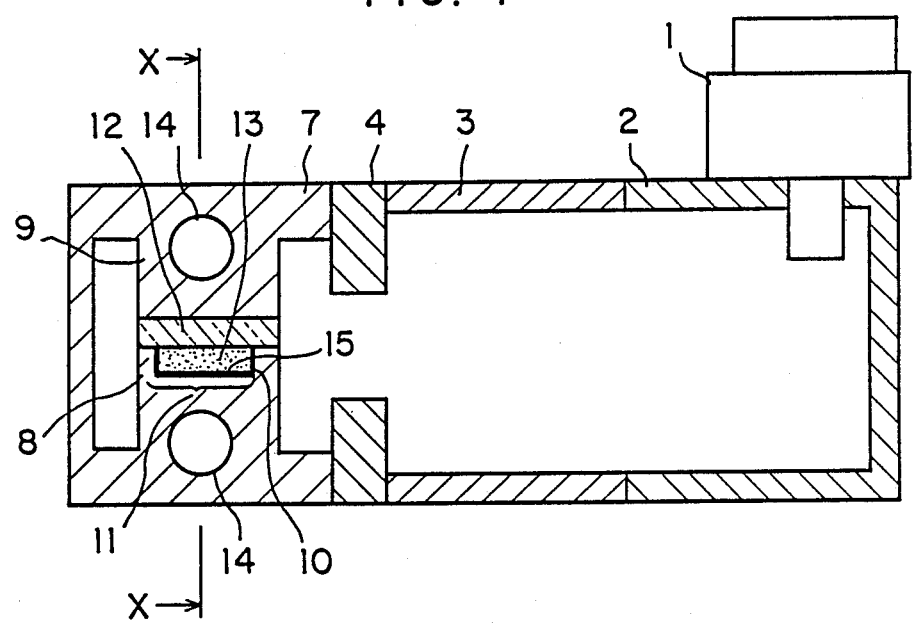
FIG. 7 is a sectional view taken along line 7—7 of FIG. 6.

FIG. 6 is a view of a gas laser apparatus as an example of plasma apparatuses in a first embodiment of the present invention. In FIG. 6, reference numeral 1 designates a magnetron being a microwave oscillator, numeral 2 designates a waveguide, numeral 3 designates a horn waveguide to enlarge the width of the waveguide 2, numeral 4 designates a microwave coupling window, numeral 5 designates a mirror for laser oscillation, and numeral 6 designates a laser head section. FIG. 7 is a sectional view taken in line 7—7 of FIG. 6 illustrating details of the gas laser apparatus. As shown in FIG. 7, the laser head section 6 has the structure of a microwave cavity of the ridge waveguide type which is a sort of a microwave circuit. In FIG. 7, numeral 7 designates a cavity wall following the microwave coupling window 4, numerals 8 and 9 designate ridges formed on a center portion of a section of the cavity wall 7, numeral 10 designates a groove formed on one ridge 8, and numeral 11 designates a conductor wall constituting a part of the microwave circuit and the wall surface of the groove 10 is used therefor in this embodiment. Numeral 12 designates a dielectric such as alumina installed opposite to the conductor wall 11 for acting as an incident window of microwave, and numeral 13 designates a discharge space formed between the conductor wall 11 and the dielectric 12 when the dielectric 12 covers the groove 10, and a laser gas such as $CO_2$ laser gas being a plasma generating medium is filled in the discharge space 13. Numeral 14 designates a cooling water path formed in the ridges 8 and 9.

In the gas laser apparatus according to the invention constituted as above described, microwave generated by the magnetron 1 passes through the waveguide 2 and is widened by the horn waveguide 3. After impedance matching by the microwave coupling window 4 for good efficiency, the microwave is coupled with the laser head section 6. Since the laser head section 6 has a cross-section of ridge cavity form as shown in FIG. 7, the microwave is concentrated between the ridges 8 and 9. The strong electromagnetic field of the concentrated microwave causes the discharge breakdown of the laser gas filled in the discharge space 13 and generates plasma and excites the laser medium. Cooling water flows in the cooling water path 14 so as to cool the discharge plasma, and discharge conditions such as pressure of the laser gas are suitably selected; thereby the laser oscillation conditions can be obtained. A laser resonator is formed by the mirror 5 in FIG. 6 and another mirror (not shown); thereby the laser oscillation rays can be obtained.

In this case, in the gas laser apparatus according to the present invention, since microwave discharge is performed in the discharge space 13 formed between the conductor wall 11 constituting a part of the microwave circuit and the dielectric 12 as a microwave incident window installed opposite to the conductor wall 11, it follows that the entering of the microwave is performed only from one side of the plasma. Consequently, such phenomenon does not occur that microwave mode of coaxial mode using the plasma as an inner conductor becomes predominant; thereby discharge by expected microwave mode can be performed.

Figure 8:
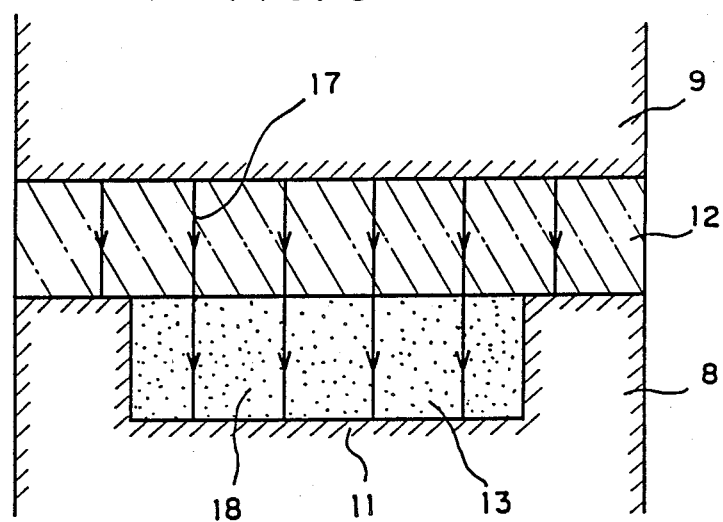
FIG. 8 is an enlarged sectional view of a main part illustrating the state of discharge in FIG. 7.

When the microwave circuit forms microwave mode having an electric field component perpendicular to the boundary between the dielectric 12 and the plasma as in the ridge cavity shown in FIG. 7, since the dielectric 12 and the conductor wall 11 are installed opposite to each other, the microwave mode has the electric field component also perpendicular to the conductor wall 11; thereby the electric field penetrating the plasma is formed. In this case, even if plasma having a conductive property is generated, since the conductor wall 11 having conductivity higher than that of the plasma by several figures is opposed to the dielectric 12 as the microwave incident window, the end current of the incident microwave flows through the conductor wall 11 and the electric field near the conductor wall 11 is forcedly made perpendicular to the surface of the conductor wall 11; thereby the electric field penetrating the plasma is maintained. Consequently the microwave enters the plasma and current flows penetrating the plasma; thereby discharge plasma which is uniform in space can be obtained because of continuity of current. This state is shown in an enlarged sectional view of FIG. 8. In FIG. 8, numeral 17 designates electric line of force of the microwave electric field, and numeral 18 designates discharge plasma. According to the gas laser apparatus of the invention, since uniform discharge as shown in FIG. 8 is obtained, the discharge as a whole can be easily made suitable for the laser excitation and also the laser resonator mode and the plasma are overlapped well; thereby the laser oscillation can be obtained at significantly high efficiency and large output in comparison to a gas laser apparatus utilizing microwave discharge in the prior art.

Moreover, since the dielectric 12 and the ridge 8 on which the groove 10 is formed are closely contacted with each other in surface and the laser gas is filled therein, when pressure of the laser gas is lower than the atmospheric pressure, for example, in the case of $CO_2$ gas laser apparatus, an external pressure is applied to the dielectric 12; thereby the laser gas can be easily sealed. If necessary, the closely contacted surface may be bonded by an adhesive agent or separate pressure may be applied from outside. In any case the laser gas can be sealed quite easily by structure in which that the groove 10 is covered by the dielectric 12.

Although the microwave cavity of the ridge waveguide type is used in the microwave circuit in the embodiment as above described, a microwave circuit of another type; such as rectangular cavity; may be used and a similar effect to the above-mentioned effect can be obtained.

Figure 1:
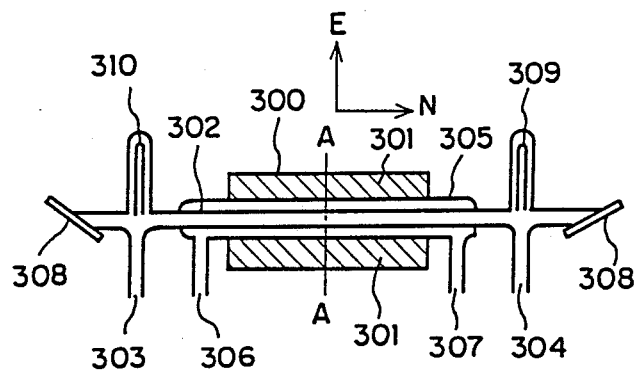
FIG. 1 is a sectional view of a gas laser apparatus in the prior art.
Figure 2:
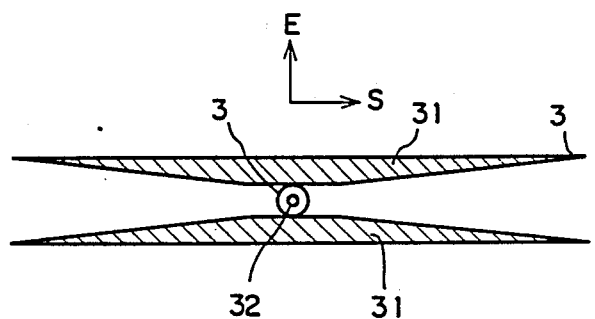
FIG. 2 is a sectional view taken in line 2—2 of FIG. 1.
Figure 3:
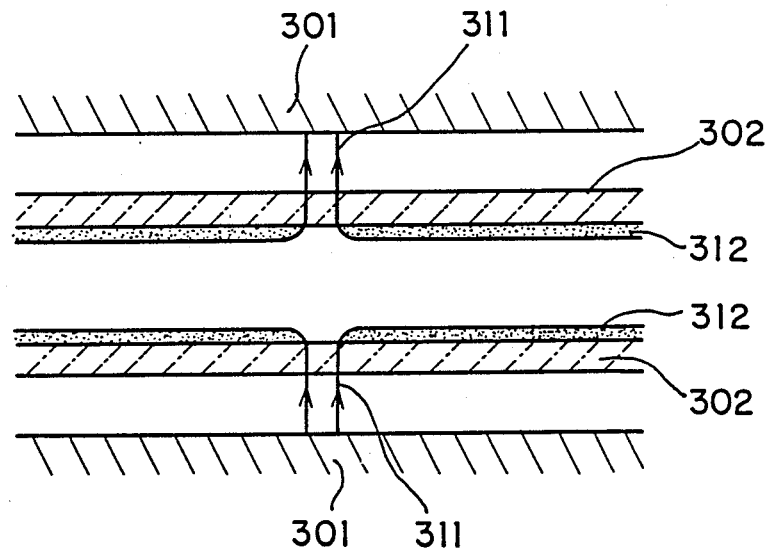
FIG. 3 is a sectional view illustrating state of discharge in a gas laser apparatus in the prior art.
Figure 4:
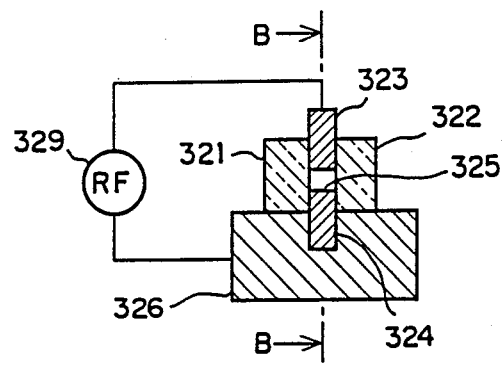
FIG. 4 is a sectional view of a waveguide type gas laser apparatus in the prior art.
Figure 5:
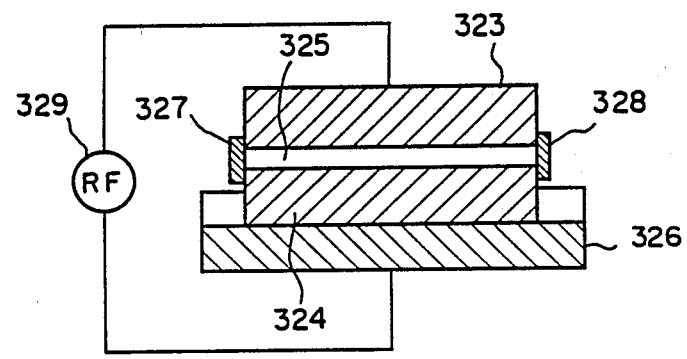
FIG. 5 is a sectional view taken along line 5—5 of FIG. 4.
Figure 9:
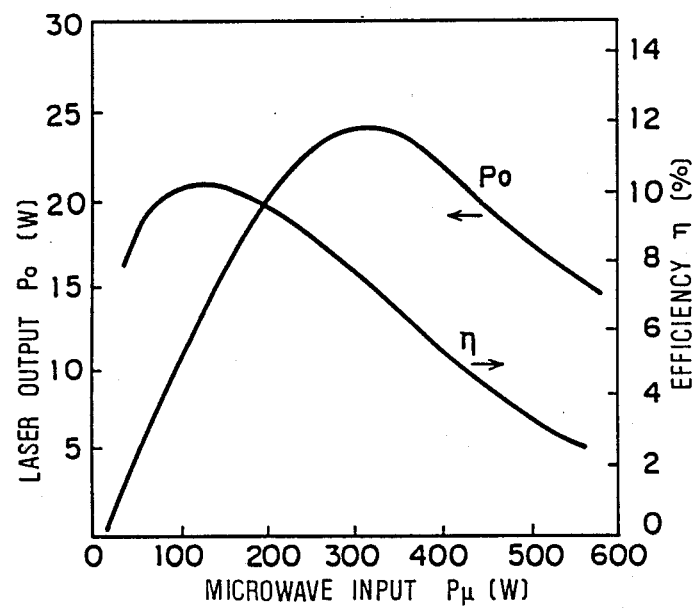
FIG. 9 is a graph illustrating laser oscillation characteristics in FIG. 6 and FIG. 7.

FIG. 9 is a graph illustrating experimental results when the apparatus having the constitution shown in FIG. 6 and FIG. 7 and a discharge length 300 mm is applied to the $CO_2$ laser. In FIG. 9, the abscissa indicates microwave input of frequency 2.45 GHz, and the ordinate indicates the $CO_2$ laser output and efficiency. As shown in FIG. 9, maximum output 24 W and maximum efficiency 10.5% are obtained, that is, the output becomes larger than the $CO_2$ laser output 15 mW reported in the prior art shown in FIGS. 1 and 2 by three times or more. Furthermore, although only pulse oscilation can be obtained in the prior art, it has been confirmed that CW oscillation can be performed in the apparatus according to the present invention.

According to the gas laser apparatus in the first embodiment of the present invention, since the metal wall to confine the microwave and the discharge plasma are closely contacted with each other, the cooling can be performed from outside of the metal wall freely and effectively. Consequently, the apparatus is favorably applied to a laser where cooling of the laser gas is important, for example, $CO_2$ laser. Moreover, since effect of the magnetic field is not used, the apparatus can be applied also to a high pressure laser such as excimer laser, and a device for generating the magnetic field is not required and therefore the apparatus becomes compact and simple.

Figure 10:
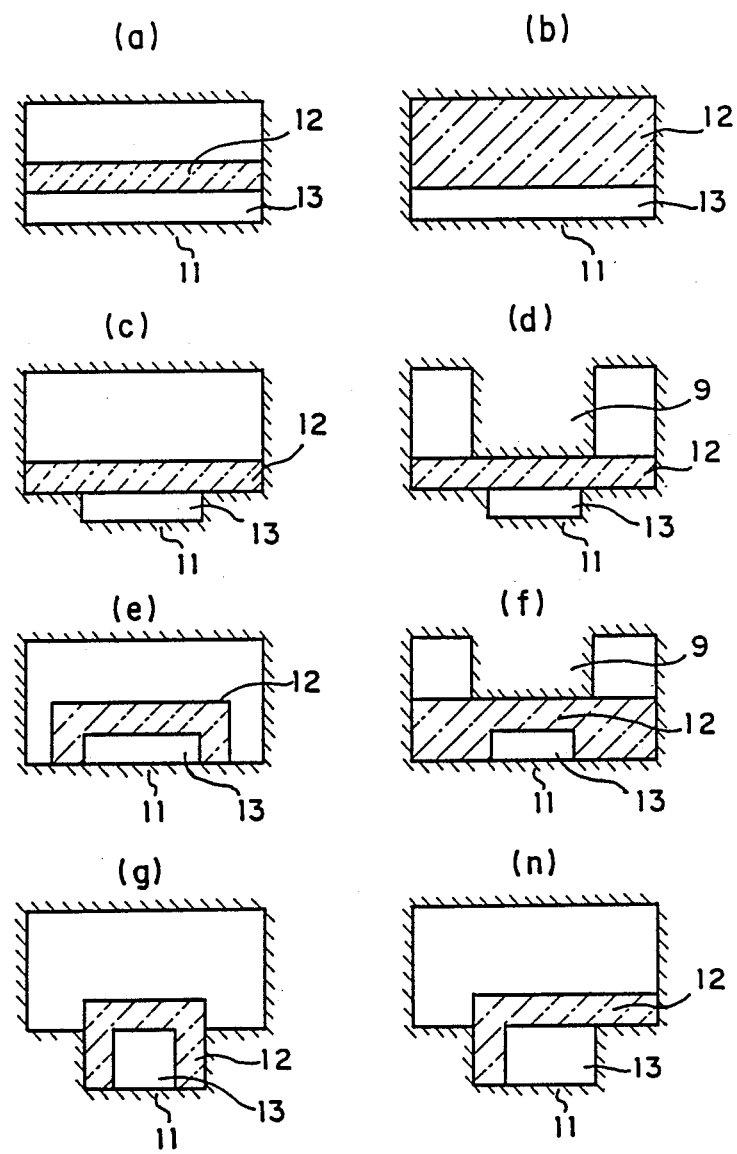
FIGS. 10(a)–10(h) are diagrams illustrating various examples of a discharge space 13.

The above-mentioned gas laser apparatus can take further various apparatus constitutions depending on type of the microwave circuit and methods of the discharge space 13. FIGS. 10(a)–10(h) are sectional views illustrating examples of the discharge space 13 where a microwave cavity or a waveguide is used as a microwave circuit. In these figures, numeral 11 designates a conductor wall, numeral 12 designates a dielectric, and numeral 13 designates a discharge space. In FIG. 10(a), the microwave cavity is partitioned by the dielectric 12 so as to form the discharge space 13, and the apparatus provides the advantage of easy manufacturing. In FIG. 10(b), space other than the discharge space 13 is filled with the dielectric 12; thereby unnecessary discharge in the space other than the discharge space 13 can be prevented. In FIG. 10(c), a groove formed in the cavity wall is made the discharge space 13, and the apparatus has the advantage that a discharge space 13 of any size can be formed. In FIG. 10(d), a ridge 9 is added to the apparatus in FIG. 10(c), and the apparatus in FIG. 10(d) is advantageous in comparison to the apparatus in FIG. 10(c) in that a laser gas of high pressure can be discharged, and matching becomes easy. In FIG. 10(e), a dielectric 12 having a recess is utilized, and the apparatus is advantageous in that a discharge space 13 of any size can be formed using a microwave cavity of standard shape. In FIG. 10(f), the ridge 9 is added to the apparatus in FIG. 10(e), and the apparatus in FIG. 10(f) is advantageous in comparison to the apparatus in FIG. 10(e) in that a laser gas of high pressure can be discharged, and matching becomes easy. FIGS. 10(g), (h) show utilization in combination of these constitutions. As shown in FIG. 10, the conductor wall 11 to constitute a part of the microwave circuit and the dielectric 12 installed opposite to the conductor wall 11 are suitably selected, thereby the discharge space 13 can be designed more freely, and uniform discharge similar to that shown in FIG. 8 can be obtained.

FIGS. 11(a)–11(c) are sectional views illustrating embodiments where a coaxial line or a strip line is used as a microwave circuit. FIG. 11(a) shows an embodiment where the outer conductor of the coaxial line is utilized as the conductor wall 11 to constitute a part of the microwave circuit; FIG. 11(b) shows an embodiment where the inner conductor of the coaxial line is made the conductor wall 11; and FIG. 11(c) shows an embodiment where a strip line is used. Since the coaxial line and the strip line shown in FIG. 11 do not have a cutoff frequency, for example, when a microwave of 2.45 GHz is used, the apparatus as a whole can be made more compact in comparison to apparatus using the microwave cavity and therefore is advantageous. In each of FIGS. 11(a), (b), (c), of course, various apparatus structures corresponding to those used in the discharge space shown in FIG. 10 can be employed.

Figure 12:
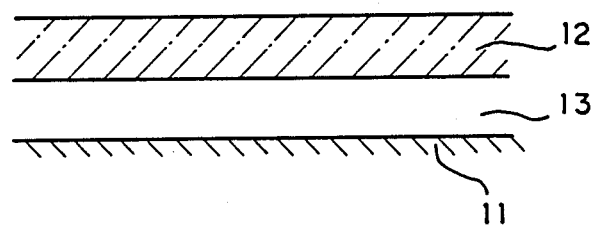
FIGS. 12(a) and 12(b) are diagrams illustrating still another embodiment of a microwave circuit.
Figure 12:
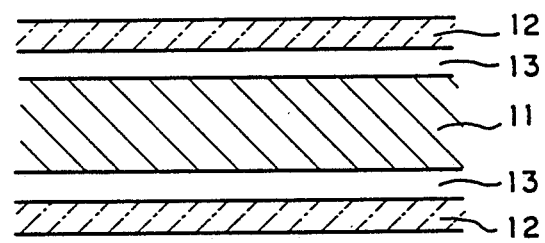

FIGS. 12(a) and 12(b) are sectional views illustrating embodiments where a surface wave line is used as a microwave circuit. FIG. 12(a) shows an embodiment where a conductor flat plate is made the conductor wall 11 and a dielectric flat plate is made the dielectric 12 so that the discharge space 13 is formed and at the same time the surface wave line is constituted. FIG. 12(b) shows an embodiment where a conductive cylinder is made the conductor wall 11 and a dielectric tube surrounding the conductive cylinder is made the dielectric 12 so that the discharge space 13 is formed and at the same time the surface wave line is constituted. As shown in FIG. 12(a)–(b), when the surface wave line is used, the microwave circuit and the discharge space can be constituted simultaneously using minimum components, and the apparatus is simplified and advantageous. Also in each of the embodiments of FIGS. 12(a), (b), various apparatus constitutions corresponding to those used in the discharge space shown in FIG. 10 can be employed.

Figure 13:
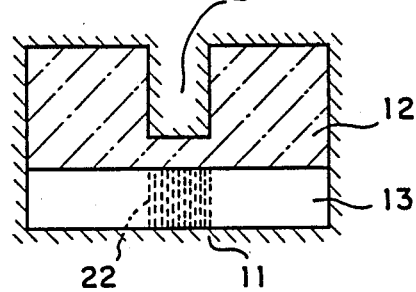
FIGS. 13(a)–13(b) are diagrams illustrating an embodiment where plasma is generated in a part of a discharge space 13.
Figure 13:
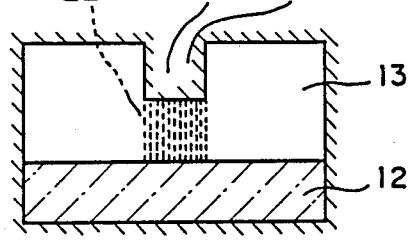

In the embodiments as hereinbefore described, although the plasma is generated substantially in the whole of the discharge space 13 formed between the conductor wall 11 constituting a part of the microwave circuit and the dielectric 12 installed opposite to the conductor wall 11, the plasma may be generated only in a part of the discharge space 13. FIGS. 13(a) and 13(b) are sectional views illustrating embodiments where a projection 21 is provided on a part of the microwave circuit, and plasma 22 is generated in a strong electromagnetic field formed in a part of the discharge space by the projection 21. FIG. 13(a) shows an embodiment where the projection 21 is provided on the outside of the discharge space 13, and FIG. 13(b) shows an embodiment where the projection 21 is provided on the inside of the discharge space 13. According to the constitution of FIG. 13(a)–(b), the discharge plasma can be concentrated in a part only of the discharge space 13, and a laser apparatus of three-axis orthogonal type can be easily obtained. Also a laser gas of high pressure can be discharged, and the plasma of high discharge power density can be easily generated.

According to the gas laser apparatus in the first embodiment of the invention as above described, since the laser gas generating plasma by the microwave discharge is filled in a space formed between a conductor wall constituting a part of a microwave circuit and a dielectric installed opposite to the conductor wall and at the same time the microwave circuit forms microwave mode having an electric field component perpendicular to the boundary between the dielectric and the plasma, a microwave discharge plasma which is uniform in space can be generated and the discharge as a whole can be made suitable for the laser excitation. Further the laser resonator mode and the plasma can be overlapped well; thereby the gas laser apparatus of high efficiency and large output can be obtained.

Furthermore, since a groove is formed on the conductor to constitute a part of the microwave circuit and an opening portion of the groove is covered by the dielectric so as to form a space, and a plasma generating medium is filled in the space, filling of the plasma generating medium into the space can be performed easily.

Next, a gas laser apparatus as one of plasma apparatuses according to a second embodiment of the present invention will be described. In the second embodiment, plasma which is more uniform in space can be generated by microwave discharge of a pulse microwave.

Constitution of the gas laser apparatus in the second embodiment is similar to that of the first embodiment shown in FIGS. 6 and 7. Consequently, the same parts are designated by the same reference numerals.

Figure 14:
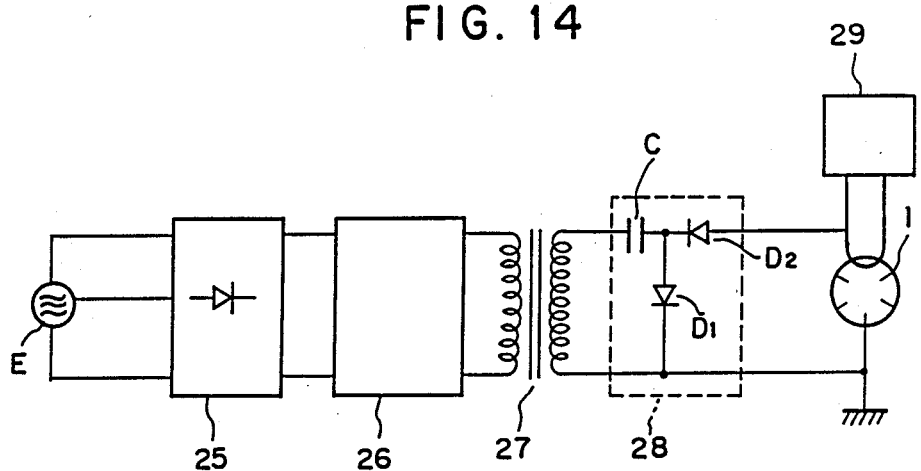
FIG. 14 is a circuit diagram of a power source to drive a magnetron 1 in a gas laser apparatus as a second embodiment of the present invention.

A power source to drive a magnetron 1 is constituted as shown in FIG. 14. In FIG. 14, AC power from a commercial frequency AC power source E is converted into DC by a rectifying and smoothing circuit 25, and the DC is converted into high-frequency AC such as 20 KHz by a DC-AC inverter circuit 26. The high-frequency AC is stepped up by a transformer 27, and converted into ripple current of high voltage by a half-wave voltage multiplying rectifier circuit 28 constituted by a capacitor C and diodes $D_1$, $D_2$, and then applied to the magnetron 1. Numeral 29 designates a filament power source of the magnetron 1.

Main operation of the gas laser apparatus of the second embodiment constituted as above described is similar to that of the apparatus of the first embodiment. In FIG. 8, in vertical direction to the paper surface of the figure, i.e., in the length direction of discharge, a mode of discharge is produced corresponding to mode of the microwave.

Figure 15:
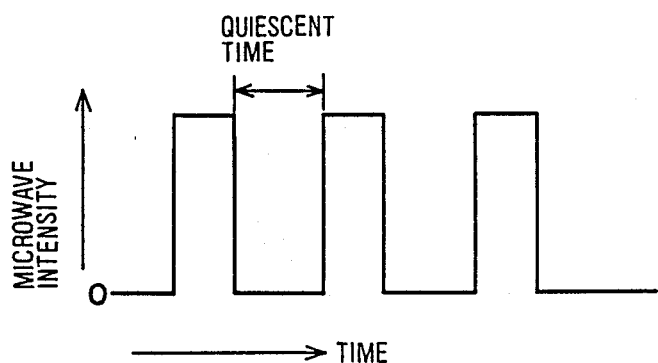
FIG. 15 is a diagram illustrating waveform of the microwave generated by the magnetron 1.

Also in this embodiment, since the apparatus shown in FIG. 14 is used as the power source of the magnetron which is a microwave oscillator to generate a microwave, the waveform of the microwave generated by the magnetron driven by the power source becomes as shown in FIG. 15. That is, a pulse microwave interrupted by high frequency is generated. Pulse duty of the pulse microwave can be made a very high value such as 0.1–0.4 in comparison to the pulse microwave in the prior art. Consequently, the quiescent time of the microwave becomes sufficiently shorter than the thermal time constant of the plasma generating medium, for example, $CO_2$ laser gas. Also the pulse frequency can be made very high such as several tens kHz. When the apparatus of FIGS. 6–7 is operated in such manner, it has been confirmed that the length of discharge interrupted by the mode of the microwave electromagnetic field in the length direction becomes short, and the discharge becomes more uniform also in the length direction. If the pulse frequency is about 500 Hz or more, since the quiescent time of the pulse microwave further becomes shorter than the thermal time constant of the filled plasma generating medium, the time modulation of the plasma parameter is suppressed and plasma which is also uniform in time is generated.

In this case, 2M120 (manufactured by Hitachi, Ltd.) was used as the magnetron 1, and a microwave of about 2.45 GHz was generated. The pulse frequency was 20 kHz, and the pulse duty was 0.4. Thus similar results to the graph of FIG. 9 were obtained.

Although the inverter is used as the power source of the magnetron 1 in the embodiment as above described, a power source of the chopper type applied to the magnetron 1 from a DC power source of high voltage through a switching element may be used so as to generate the pulse microwave. Moreover, although the laser apparatus is shown as a plasma apparatus in the embodiment, the invention may be applied to an ion source or a light source plasma processing apparatus, and a similar effect can be obtained in that the discharge is made uniform in space and in time.

Furthermore, although the conductor and the plasma are contacted with each other in the embodiment as above described, when a thin dielectric layer such as a dielectric coating layer is provided on the conductor surface, since this dielectric layer does not significantly affect the electric field distribution of the microwave, of course, the above-mentioned effect is not deteriorated.

According to the second embodiment of the invention as above described, the plasma generating medium is filled in a space formed between a conductor wall to constitute a part of the microwave circuit in the plasma apparatus and dielectric installed opposite to the conductor wall, and the microwave circuit forms microwave mode having a component perpendicular to the boundary with the dielectric and the pulse microwave is excited in the microwave circuit; thereby a plasma is uniform in space can be obtained.

Further in the second embodiment of the invention as above described, since a pulse microwave having the quiescent time shorter than the thermal time constant of the plasma generating medium such as $CO_2$ laser gas is excited in the microwave circuit, a plasma which is uniform in space and in time can be maintained stably for a long time, and the discharge as a whole can be easily made suitable for laser excitation, and the laser resonator mode and the plasma can be overlapped well. Thereby a $CO_2$ gas laser apparatus which enables laser operation of high efficiency and large output can be obtained.

Another embodiment of the power source apparatus to supply pulse voltage to a non-linear load such as the magnetron 1 will now be described.

Figure 16:
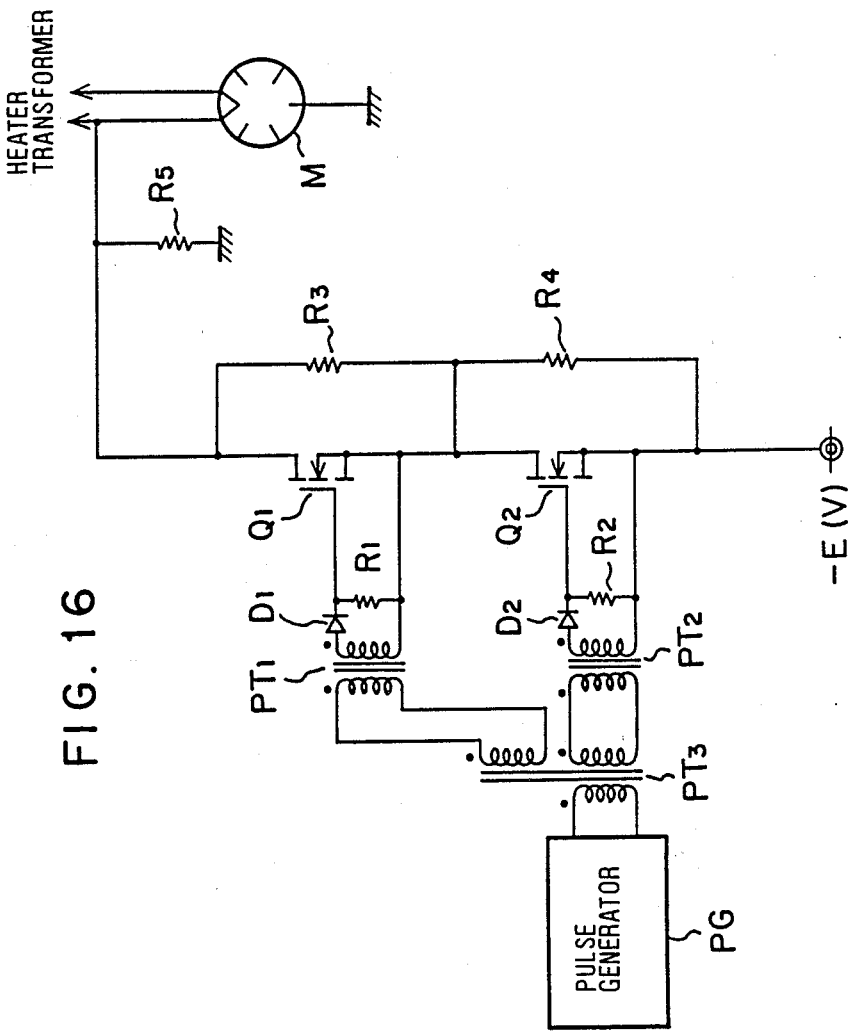
FIG. 16 is a circuit diagram illustrating another embodiment of a power source apparatus.

FIG. 16 is a circuit diagram of the power source apparatus. In FIG. 16, M designates a magnetron as a non-linear element, $Q_1$, $Q_2$ designate field effect transistors (hereinafter referred to as "FET") as a semiconductor switching element, $PT_1$, $PT_2$, $PT_3$ designate pulse transformers to apply voltage to the gate of the FET $Q_1$, $Q_2$, $D_1$, $D_2$ designate reverse-current blocking diodes, $R_3$, $R_4$, $R_5$ designate dividing resistors for high voltage, and PG designates a pulse generator.

Next, operation will be described. When a pulse is not applied to the pulse transformer $PT_3$ from the pulse generator PG, the FET $Q_1$, $Q_2$ are turned off. Then, if voltages applied to the FET $Q_1$, $Q_2$ and the magnetron M are made $V_{oQ1}$, $V_{oQ2}$ and $V_{oM}$ respectively and the power source voltage is made $-E(V)$, if follows that $$V_{oQ1} = -E \frac{R_3}{R_3 + R_4 + R_5} \ (V),$$

$$V_{oQ2} = -E \frac{R_4}{R_3 + R_4 + R_5} \ (V)$$

$$V_{oM} = -E \frac{R_5}{R_3 + R_4 + R_5} \ (V)$$

Figure 17:
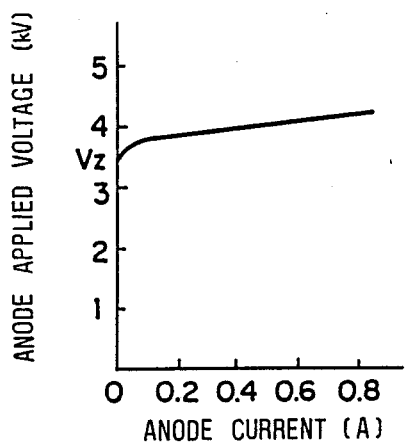
FIG. 17 is a graph illustrating the relation between anode applied voltage and current of a magnetron M in the power source apparatus of FIG. 16.

The relation between the anode applied voltage and the anode current in the magnetron M becomes as shown in FIG. 17, and current does not flow at the cutoff voltage $V_z$ or less. Consequently, if the values of the dividing resistors $R_3$–$R_5$ are determined so that $V_{oM} < V_z$, the magnetron M does not act when the FET $Q_1$–$Q_2$ are turned off. Further, if the values of the dividing resistors $R_3$–$R_5$ are determined so that the relation of withstand voltage of the FET $Q_1$, $Q_2$ to $V_{DSS}$ (drain-source voltage) becomes $V_{oQ1}$, $V_{oQ2} < V_{DSS}$, since voltage over the withstand voltage is not applied to the FET $Q_1$, $Q_2$ when the FET $Q_1$, $Q_2$ are turned off, the FET $Q_1$, $Q_2$ are not broken down.

If a pulse is applied to the pulse transformer $PT_3$ from the pulse generator PG, the pulse is applied to gate of the FET $Q_1$, $Q_2$ and therefore the FET $Q_1$, $Q_2$ are turned on. Then since the magnetron M is supplied with the power source voltage $-E(V)$, the magnetron M acts and a microwave is generated. Thus every time a pulse is applied to the pulse transformer $PT_3$ from the pulse generator PG, the magnetron M acts and the microwave is generated in pulse form. Since the FET $Q_1$, $Q_2$ are connected to the high voltage circuit, they must be insulated from the power source of the pulse generator PG. However, if the insulation withstand voltage of the pulse transformers $PT_1$–$PT_3$ is made E(V) or more, the pulse generator PG is insulated from the high voltage circuit and therefore can be constituted in ordinary power source potential or ground potential.

In the embodiment of FIG. 16, the two FET $Q_1$, $Q_2$ are connected in series and used as the semiconductor switching element, but the number is determined by the withstand voltage. That is, the withstand voltage of the semiconductor switching element may be made higher than difference $(E-V_z)$ (V) between the operation voltage E(V) of the magnetron M and the cutoff voltage $V_z$(V). For example, if $V_z=3.2$ kV and E=4.2 kV, voltage applied to the semiconductor switching element at OFF-state must be set to 1 kV or more. Consequently, since the withstand voltage of the FET should be 1 kV or more, two FET each having the withstand voltage being 500 V or more, preferably 700–800 V must be used.

Figure 18:
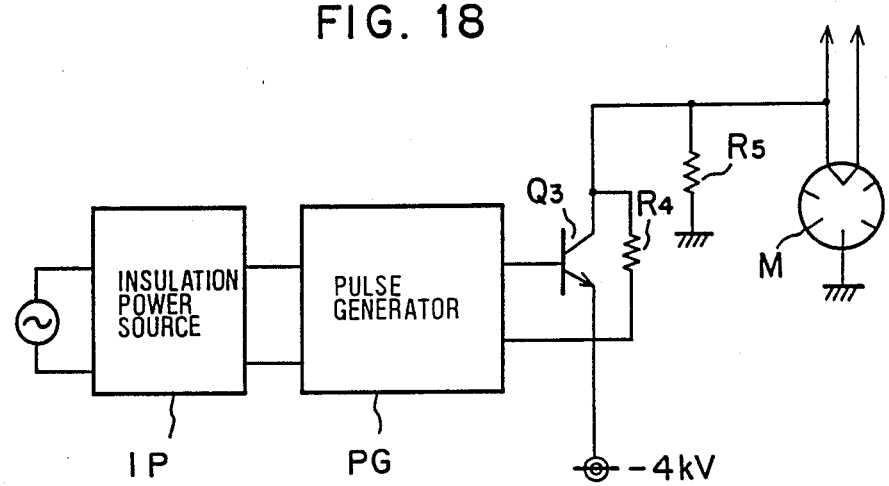
FIG. 18 is a circuit diagram of a further embodiment of a power source apparatus.

FIG. 18 is a circuit diagram illustrating another embodiment where one bipolar transistor is used as the semiconductor switching element.

In FIG. 18, the same or similar parts to those of FIG. 16 as hereinbefore described are designated by the same reference numerals. In FIG. 18, $Q_3$ designates one transistor as the switching element, and IP designates an insulated power source.

Next, operation will be described. The pulse generator PG drives the base of the bipolar transistor $Q_3$ thereby the bipolar transistor $Q_3$ is turned on. Also in this case, in a similar manner to FIG. 16, values of the dividing resistors $R_4$, $R_5$ may be set so that voltage applied to the magnetron M becomes $V_z$ or less at OFF-state of the bipolar transistor $Q_3$, and voltage applied to the bipolar transistor $Q_3$ is its withstand voltage or less. Further, although the pulse generator PG is connected directly to the high voltage circuit, if the power source of the pulse generator PG is made the insulated power source IP where high-voltage insulation is performed by the power source transformer, the high voltage circuit and the primary side of the power source are insulated.

In the above-mentioned embodiment, although the magnetron M has been explained as an example of a non-linear element, any power source for the non-linear element or device where current does not flow at a voltage less than the prescribed voltage $E_z$, and current flows at the prescribed voltage $E_z$ or more can perform a similar operation.

In the power source apparatus as described above to drive the nonlinear element or device where current does not flow at voltage less than the prescribed voltage $E_z$ and current flows at the prescribed voltage $E_z$ or more, since the semiconductor switching element connected in series with the nonlinear element or device controls current flowing from the voltage source to the nonlinear element or device, the power source of high voltage is not required to provide control, and the power source apparatus of small size can be employed. Further a semiconductor switching element with relatively low withstand voltage may be used.

Next, a gas laser apparatus as a third embodiment will be described. In the third embodiment, the wall surface of the conductor of the space in which the laser gas is filled as shown in the first embodiment is coated with a ceramic layer. Thereby the wall surface of the conductor can be protected, and deterioration of the laser gas can be prevented, and further laser oscillation at high efficiency and long life becomes possible.

That is, on the wall surface of the conductor including the conductor wall 11 in FIG. 7 of the first embodiment, the ceramic layer 15 is formed by coating. If the ceramic layer 15 is formed in such manner, since the wall surface by the conductor including the conductor wall 11 of the discharge space 13 is coated with the ceramic layer 15, the plasma generated by the microwave discharge does not directly contact the conductor wall 11 or the like, and the generated plasma is not liable to sputtering and is enveloped in the ceramic layer 15 and the dielectric 12 which are inert chemically. Consequently, deterioration of the laser gas due to sputtering or chemical reaction scarcely occurs, and the wall surface by the conductor of the discharge space 13 is not subjected to damage by sputtering, thereby the plasma apparatus such as the gas laser apparatus of microwave excitation system of high efficiency and long life can be obtained.

In this case, in order to obtain a stable uniform discharge in space, it is necessary that the microwave be incident to the plasma from one surface only thereof. Consequently, it is preferable that the thickness of the ceramic layer 15 be sufficiently less than that of the dielectric 12. When the thickness of the ceramic layer 15 is made 1/10 of that of the dielectric 12 or less, it has been confirmed that most of the microwave energy is injected from the dielectric 12 side of the plasma. Moreover, it is necessary that the impedance of the end of the incident microwave be less than the impedance of the plasma. When the specific dielectric constant of the ceramic layer 15 is made $\epsilon r$, the thickness of the ceramic layer 15 is made d, surge impedance of the vacuum is made $Z_o$, and resistivity of the plasma is made $\delta$, the following relation must be satisfied.

$$(d/\epsilon r)<(\delta/Z_o)$$

Further, in laser apparatus using a laser gas including halogen gas having high chemical activation, such as an excimer laser apparatus, of course, material which does not react with halogen group should be used as the ceramic layer 15.

Next, a fourth embodiment will be described according to FIG. 19. In the fourth embodiment, a reservoir tank communicating with the space formed by the conductor wall and the dielectric is installed, and the plasma generating medium is stored in the reservoir tank. Thereby deterioration of the plasma generating medium such as the laser gas is prevented, and a plasma apparatus which enables operation at high efficiency and large output can be obtained.

Figure 19:
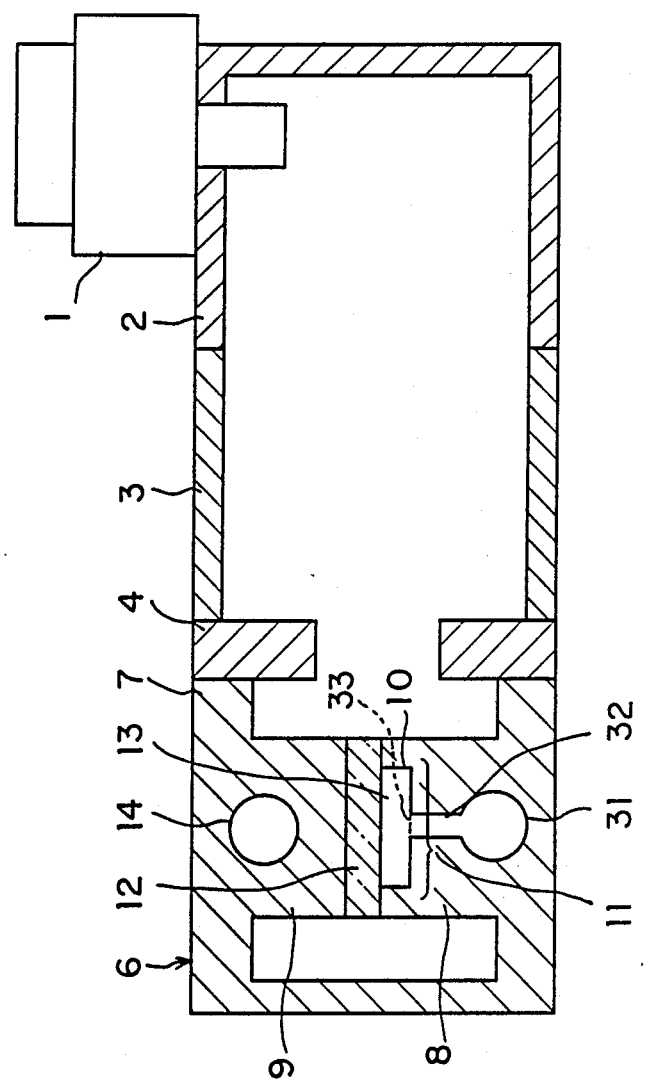
FIG. 19 is a sectional view of a gas laser apparatus as a fourth embodiment.

FIG. 19 shows the constitution of the apparatus. In FIG. 19, parts common to the gas laser apparatus of FIG. 7 are designated by the same reference numerals and the description thereof shall be omitted. In FIG. 19, numeral 31 designates a reservoir tank which is formed in the conductor behind the conductor wall 11 of the ridge 8 for storing the laser gas to replace the laser gas within the discharge space 13, numeral 32 designates one or plural connection penetrating holes to perform communication between the reservoir tank 31 and the discharge space 13, and numeral 33 designates a gas permeable member, for example, a metal mesh or the like, which is arranged at an opening portion in the discharge space 13 of the connection penetrating hole 32 and passes the laser gas and reflects the microwave.

Since the reservoir tank 31 is installed as above described, the laser gas in the reservoir tank 31 suitably replaces the laser gas in the discharge space 13 through the connection penetrating hole 32 and the gas permeable member 33, thereby even if the laser oscillation is performed for a long time, deterioration of the laser gas can be suppressed to a minimum and the laser gas is made long life. In this case, since the gas permeable member 33 of metal mesh or the like is arranged at the opening portion in the discharge space 13 of the connection penetrating hole 32, the microwave mode in the discharge space 13 is not disturbed.

In the embodiment, although the gas permeable member to reflect the microwave and to pass the laser gas is arranged at the end portion of the connection penetrating hole at the side of the discharge space, if the connection penetrating hole is made of cutoff size or less so as not to transmit the microwave, the gas permeable member may be omitted and similar effects to those of the above embodiment are obtained.

According to the invention as above described, the plasma generating medium such as laser gas to generate the plasma by the microwave discharge is filled in the space formed between the conductor wall formed on a part of the microwave circuit and the dielectric installed opposite to the conductor wall, and the plasma generating medium is suitably replaced by the medium stored in the reservoir tank, and further the microwave circuit forms the microwave mode having an electric field distribution orthogonal to the boundary between the dielectrics and the plasma, plasma which is uniform in space can be stably maintained for a long time and the discharge as a whole can be made suitable for the laser excitation. Further, since deterioration of the plasma producing medium can be prevented without adding a large-scale apparatus the outside for changing the plasma generating medium, a compact plasma apparatus can be obtained at high efficiency, large output and long life.

Figure 20:
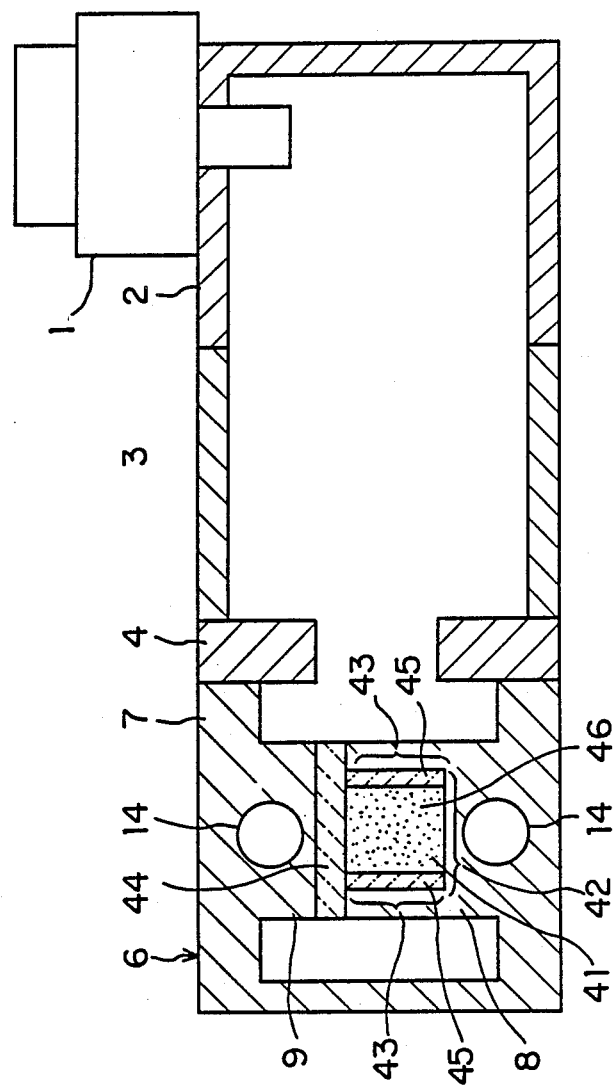
FIG. 20 is a sectional view of a gas laser apparatus as a fifth embodiment.

Next, a fifth embodiment of the invention will be described referring to FIG. 20 and FIG. 21. In the fifth embodiment, uniform discharge can be obtained particularly even at a discharge space of large area. FIG. 20 shows a gas laser apparatus according to the fifth embodiment. In FIG. 20, parts common to those in FIG. 7 of the first embodiment are designated by the same reference numerals.

In FIG. 20, numeral 41 designates a recess formed in one ridge 8, numeral 42 designates a conductor wall which constitutes a part of the microwave circuit and forms a bottom surface of the recess 41, and numeral 43 designates a second conductor wall which forms side surface of the recess 41. Numeral 44 designates a first dielectric, for example, alumina, which covers an opening portion of the recess 41 and is opposite to the first conductor wall 42 and acts as an incident window of microwave. Numeral 45 designates a second dielectric, for example, alumina, which is arranged on the wall surface of the second conductor wall 43. Numeral 46 designates a discharge space which is formed between the first dielectric 44 and the second dielectric 45 when the first dielectric 44 covers the opening portion of the recess, and in which the plasma generating medium such as $CO_2$ laser gas is filled, and numeral 14 designates a cooling water path formed on the ridge 8 and the ridge 9.

Main part of the laser excitation operation of the fifth embodiment is similar to the case of the first embodiment described in FIG. 7. In this case, microwave discharge is performed in the discharge space 46 which has the first conductor wall 42 constituting a part of the microwave circuit, and the first dielectric 44, which is installed opposite to the first conductor wall 42 and provides an incident window of the microwave. Since the microwave is incident to the plasma only from one surface thereof, the microwave mode of the coaxial mode using the plasma as an inner conductor does not become predominant, and discharge by expected microwave mode can be performed. Also when the microwave circuit forms the microwave mode having the electric field component orthogonal to the boundary between the first dielectric 44 and the plasma as in the ridge cavity of the laser head section 6 shown in the figure, since the first dielectric 44 and the first conductor wall 42 are opposite to each other, the electric field component is orthogonal also to the first conductor wall 42. Thereby the electric field penetrating the plasma is produced. Consequently, even if a plasma having conductivity is generated, since the first conductor wall 42 which has the conductivity higher by several times than the plasma is installed opposite to the first dielectric 44 as a microwave incident window, the end current of the incident microwave flows through the first conductor wall 42 and the electric field near the first conductor wall 42 is made forcedly orthogonal to the surface of the first conductor wall 42. Thereby the electric field penetrating the generated plasma is maintained. Consequently, the microwave enters into the plasma and the current penetrating a plasma flows and the discharge plasma which is uniform in space is generated because of the continuity of current.

This applies without problem to the case shown in FIG. 21(a) where the discharge space 46 is small and the distance between the first conductor wall 42 and the first dielectric 44 is small. However, in order to increase the discharge space 46, if the distance between the first conductor wall 42 and the first dielectric 44 is increased, impedance of the plasma within the discharge space 46 becomes large, and the electric field component bypassing the second conductor wall 43 is produced as shown in FIG. 21(b). Consequently, the electric lines of force 47 directed to the second conductor wall 43 be predominant rather than those directed to the first conductor wall 42, and uniformity of the generated plasma is deteriorated. Therefore the second dielectric 45 is arranged between the second conductor wall 43 and the plasma within the discharge space 46, and as shown in FIG. 21(c), the second dielectric 45 weakens the electric lines of force 47 directed to the second conductor wall 43 and strengthens the electric lines of force 47 directed to the first conductor wall 42 so that the electric field component orthogonal to the first conductor wall 42 becomes predominant. Thereby the uniform discharge in space is obtained and the discharge as a whole can be easily made suitable for the laser excitation.

In this embodiment, although application to a gas laser apparatus has been described, the invention may be applied to a plasma processing apparatus, an ion source, a light source or the like, and similar effects to this embodiment can be obtained.

According to the invention as above described, the first conductor wall on the bottom surface constituting a part of the microwave circuit, and the second conductor wall on the side surface constitute the recess, and an opening portion of the recess is covered with the first dielectric, and further the plasma generating medium is filled in the space formed by the second dielectric arranged on the second conductor wall, and the microwave circuit forms the microwave mode having an electric field component orthogonal to the boundary between the plasma and the first dielectric, thereby a microwave which is uniform in space is stably maintained for a long time even in a discharge space of large area, and a plasma apparatus of large diameter to generate plasma having high uniformity in space can be obtained.

Figure 22:
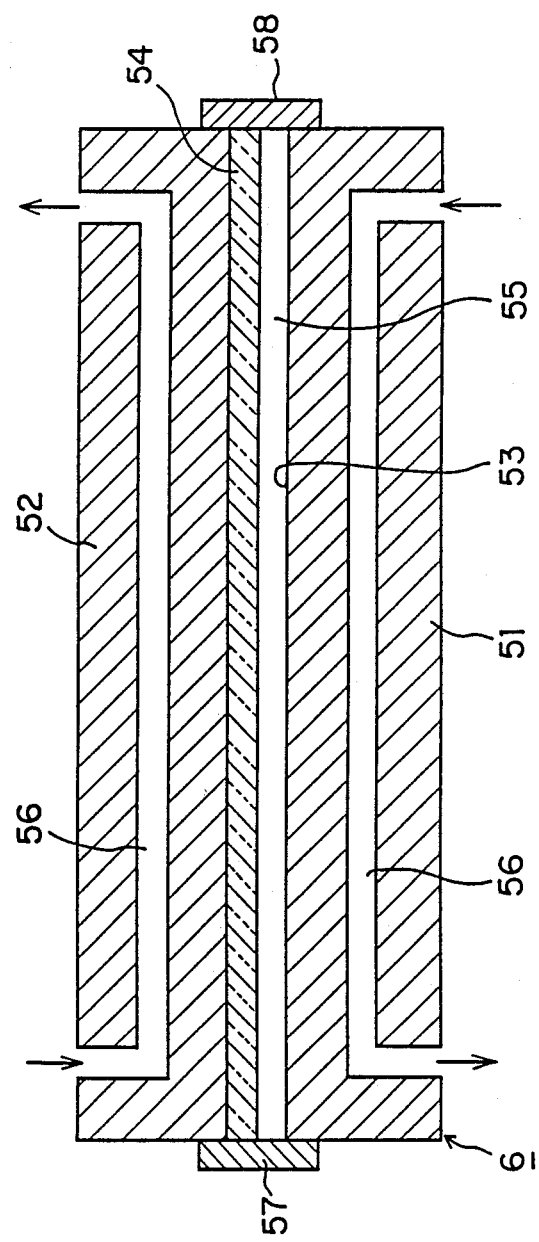
FIG. 22 is a sectional view, taken along the line 22—22 in FIG. 7, of a an optical waveguide type gas laser apparatus as a sixth embodiment.
Figure 23:
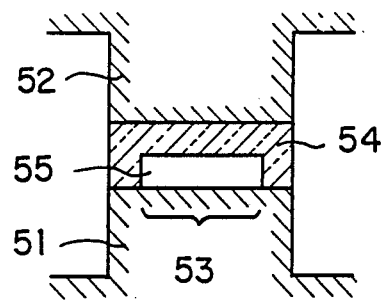
FIG. 23 is a view illustrating a modification of the sixth embodiment.

Next, a light waveguide path type gas laser apparatus in plasma apparatuses as sixth embodiment according to the invention will be described referring to FIG. 22 and FIG. 23. In this case, a sectional view of the apparatus in the sixth embodiment is the same as the sectional view of the apparatus of the first embodiment described by FIG. 7 and therefore the sixth embodiment shall be described also referring to FIG. 7. FIG. 22 is a sectional view taken along line 22—22 in FIG. 7. In FIG. 22, numeral 6 designates a laser head section, numerals 51 and 52 designate ridges installed on a cavity wall 7 following a microwave coupling window 4, numeral 53 designates a conductor wall, numeral 54 designates dielectrics as an incident window of microwave opposite to the conductor wall 53, numeral 55 designates a discharge space which is formed between the conductor wall 53 and the dielectric 54 when the dielectric 54 covers the groove formed on the ridge 51 and in which the laser gas such as $CO_2$ is filled, and numeral 56 designates a cooling water path formed on the ridge 51 having the conductor wall 53 constituting a part of the microwave circuit and on the ridge 52 opposite to the ridge 51. Also, numerals 57, 58 designate a total reflection mirror and a partial transmission mirror respectively arranged opposite to each other at both ends of the discharge space 55, and the discharge space 55 acts also as a light waveguide path having dimensions suitable to guide the generated laser rays.

Main operation of the light waveguide path type gas laser apparatus is the same as that of the first embodiment described referring to FIGS. 6–7. In the sixth embodiment, cooling water flows in the cooling water path 56 provided on the ridge 51 having the conductor wall 53 constituting a part of the microwave circuit and on the ridge 52 opposite to the ridge 51, and the conductor wall 53 and the dielectric 54 contacted directly with the laser gas within the discharge space 55 are cooled. Thereby the laser gas is cooled efficiently, and saturation of the laser output due to temperature rise of the laser gas is prevented (although this becomes a problem particularly in the case of using the $CO_2$ laser gas), and further a light waveguide path type gas laser apparatus can be obtained at high efficiency and large output.

In the embodiment, although a groove is provided on one ridge and the discharge space is formed, the dielectric provided with the groove may be held on the flat upper surface of the ridge and the discharge space may be formed. FIG. 23 is a partial sectional view illustrating the embodiment in such state. In FIG. 23, numerals 51, 52 designate ridges, numeral 53 designates a conductor wall on the upper surface of the ridge 51, numeral 54 designates a dielectric provided with a groove in its lower surface and held on the ridge 51, and numeral 55 designates a discharge space formed by the groove of the dielectric 54 and the conductor wall 53 on the upper surface of the ridge 51. The discharge space 55 also acts as a light waveguide path having dimensions suitable to guide the generated laser rays.

According to the optical waveguide type gas laser apparatus of the invention as above described, the space being a light waveguide path is formed by the conductor wall constituting a part of the microwave circuit and the dielectric opposite to the conductor wall, and laser gas is filled in the space and the microwave is entered using the dielectric as a microwave incident window. Thereby the laser excitation by the microwave becomes possible. Furthermore, since the conductor wall having conductivity higher than that of the plasma exists opposite to the dielectric into which the microwave is entered, the end current of the incident microwave flows through the conductor wall and current penetrating between the dielectric and the conductor wall flows in the plasma. Thereby the uniform plasma in the space can be stably maintained in the laser gas.

Figure 25:
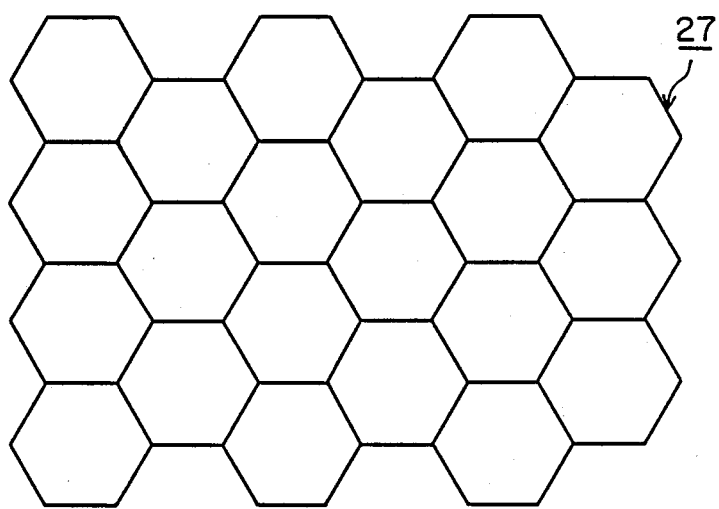
FIG. 25 is a diagram illustrating the constitution of a gas permeable member 67.
Figure 24:
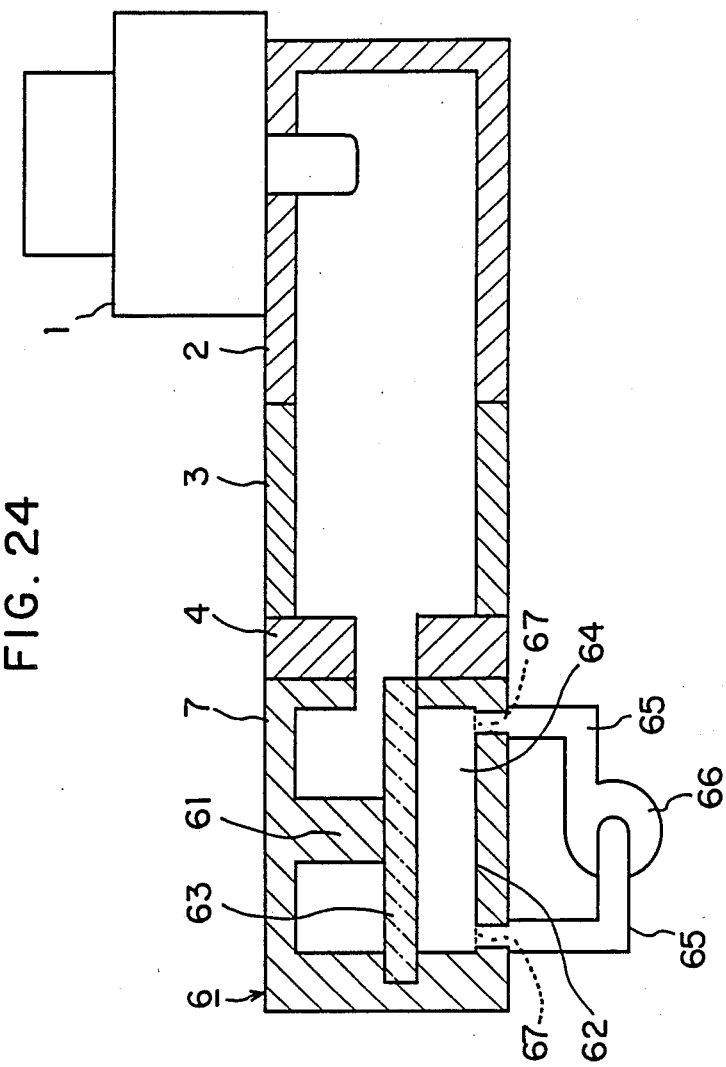
FIG. 24 is a sectional view of a gas laser apparatus as a seventh embodiment.
Figure 26:
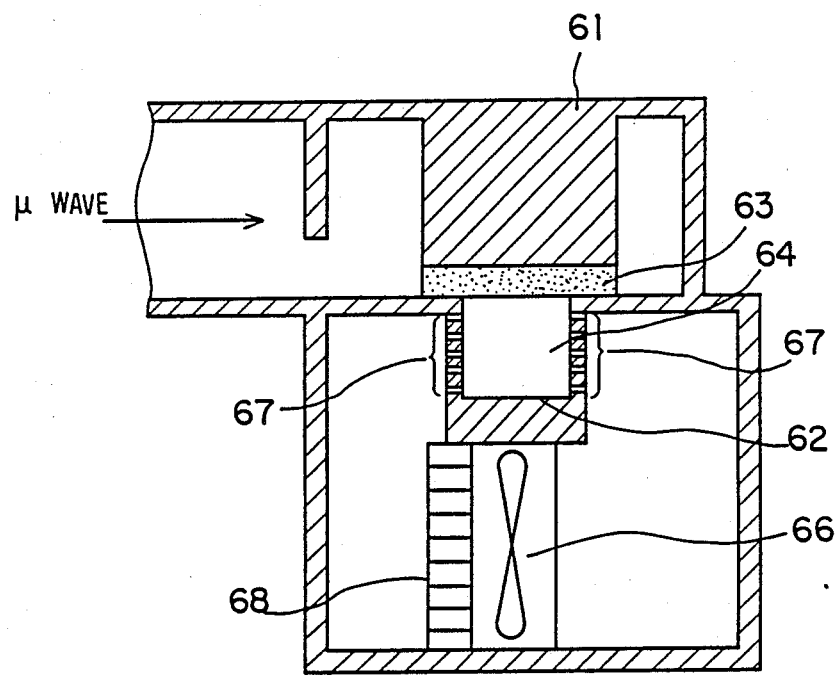
FIG. 26 is a view illustrating a modification of FIG. 24.

FIGS. 24 through 26 show a seventh embodiment where heat of a laser discharge tube is prevented by circulation means. FIG. 24 is a sectional front view of the gas laser apparatus. The appearance of the seventh embodiment is the same as that of the first embodiment shown in FIG. 6, and in FIG. 24, common parts to those in the first embodiment are designated by the same reference numerals and the description thereof is omitted. In FIG. 24, numeral 6 designates a laser head section having structure of a microwave cavity of the ridge waveguide type, numeral 1 designates a magnetron, numeral 2 designates a waveguide, numeral 3 designates a horn waveguide, and numeral 4 designates a microwave coupling window. Numeral 7 designates a cavity wall following the microwave coupling window 4 in the laser head section 6, numeral 61 designates a ridge installed on a center portion of the cavity wall 7, and numeral 62 designates a conductor wall constituting a part of the microwave circuit. In this embodiment, a flat H-surface opposite to the cavity 7 of the microwave circuit of the microwave cavity structure of the ridge waveguide type is used as the conductor wall 62. Numeral 63 designates a dielectric, for example, alumina, which is installed opposite to the conductor wall 62 and acts as a microwave incident window, numeral 64 designates a discharge space which is formed between the conductor wall 62 and the dielectric 63 and in which the laser gas such as $CO_2$ is filled, numeral 65 designates a gas feed tube communicating with the discharge space 64, numeral 66 designates a blower as circulation means installed midway of the gas feed tube 65, and numeral 67 designates a gas permeable member installed at an opening portion of the gas feed tube 65 to the discharge space 64 for reflecting the microwave. A honeycomb structure of metal, for example, as shown in FIG. 25 is used as the gas permeable member 67.

Next, operation will be described. Main operation of the laser excitation is the same as that already described. The blower 66 is operated and the laser gas within the discharge space 64 is circulated and the discharge plasma is cooled, and at the same time discharge conditions such as pressure of the laser gas are suitably selected so that the laser oscillation conditions are obtained. Since the gas permeable member 67 of the metal honeycomb structure shown in FIG. 25 is used in the opening portion of the gas feed tube 65 provided on the conductor wall 62, the laser gas passes through it but the microwave is reflected. Thereby the microwave mode within the discharge space 64 is not influenced and the forced circulation of the laser gas by the blower 66 becomes possible. As a result, a discharge plasma which is uniform in space is generated. Furthermore, since the microwave propagating freely in the dielectric 63 enters into the plasma uniformly from the boundary between the dielectric 63 and the plasma, and the microwave discharge is not likely to become an arc discharge essentially even at the electrodeless discharge, and further the dielectric 63 acts as a capacitive distribution ballast, a discharge plasma which is uniform in space can be obtained also in the transverse direction of the plasma. As a result, a discharge which is significantly uniform in space can be realized. Since the uniform discharge in space is obtained in such manner, the discharge as a whole can be easily made suitable for laser excitation. Since the laser gas is forcedly circulated by the blower 66 and cooled effectively, saturation of the laser output due to temperature rise of the laser gas can be prevented although this becomes a problem particularly when $CO_2$ gas is used as the laser gas, and in spite of the microwave excitation system, a gas laser apparatus of high efficiency and large output can be obtained.

In this embodiment, although the gas permeable member 67 is arranged on the conductor wall 62 to form the bottom surface of the discharge space 64, it may be arranged at a side wall portion of the discharge space 64. FIG. 26 is a partial sectional view illustrating such an embodiment. In this embodiment, a part of the cavity portion of the microwave circuit acts as the gas feed tube, and at the side wall portion of the discharge space 64 between the conductor wall 62 and the dielectric 63, the gas permeable member 67 formed by the metal honeycomb structure is arranged where the laser gas can pass but the microwave is reflected. Also in the embodiment, the blower 66 as a circulation means is provided with a heat exchanger 68, thereby heat of the circulated laser gas is forcedly radiated to the outside and the plasma is cooled more effectively.

In this embodiment, although a honeycomb structure of metal is used as the gas permeable member to reflect the microwave, the gas permeable member may be a conductor with a number of small holes bored therein, or a metal mesh may be used. In any case, similar effects to those of the embodiment can be obtained.

According to the embodiment of the invention as above described, since the laser gas is forcedly circulated and cooled by the circulation means, a plasma which is uniform in space can be stably maintained for a long time and saturation of the laser output due to temperature rise of the laser gas also can be prevented. Thereby the gas laser apparatus to enable laser operation at high efficiency and large output can be obtained.

Figure 27:
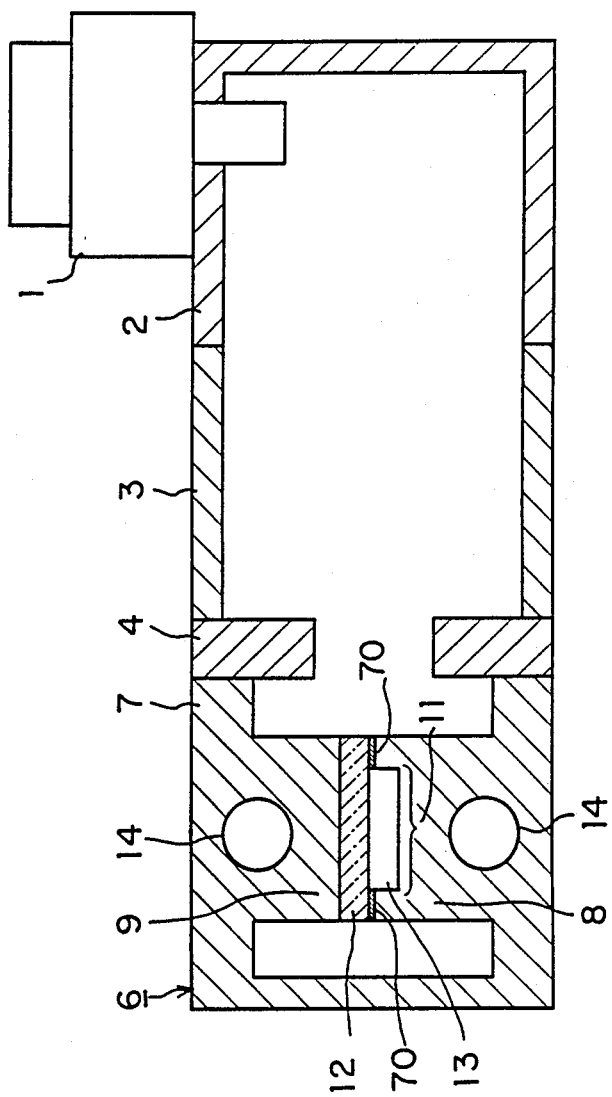
FIG. 27 is a sectional view of a gas laser apparatus as an eighth embodiment.

FIGS. 27 through 32 show an eighth embodiment where leakage of the plasma generating medium in the discharge space is prevented by an epoxy adhesive agent. In this case, FIG. 27 shows the same apparatus as the gas laser apparatus of the first embodiment shown in FIG. 7. In FIG. 27, numeral 70 designates an epoxy adhesive agent which is applied to whole surface of a portion where the dielectric 12 and the ridge 8 with the conductor wall 11 are contacted with each other and which bonds and seals both members together so that the air tightness of the discharge space 13 is improved. Thereby the discharge space 13 is sealed completely against leakage of the laser gas and stable laser oscillation can be obtained.

Figure 28:
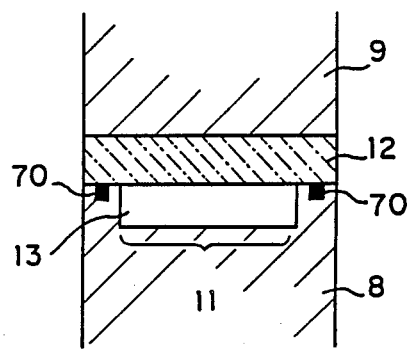
FIGS. 28 through 32 are diagrams illustrating modifications of FIG. 27.
Figure 30:
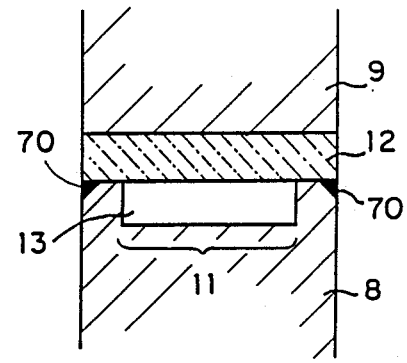
Figure 29:
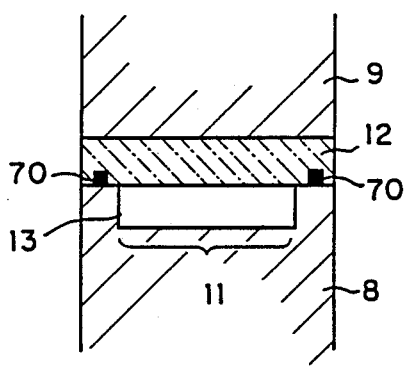
Figure 31:
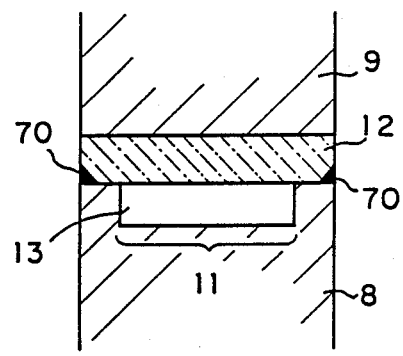
Figure 32:
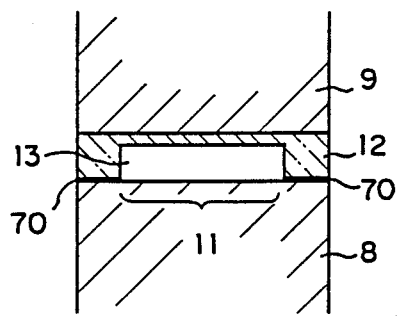

In this embodiment, although the whole surface of the contact portion between the ridge 8 and the dielectric 12 as the microwave circuit is bonded and sealed by the epoxy adhesive agent 70, a part of the contact portion may be bonded and sealed by the epoxy adhesive agent. FIGS. 28 through 31 are partial enlarged sectional views illustrating modifications wherein a part of the contact portion is bonded. In FIG. 28, a groove is provided in the contact portion between the ridge 8 and the dielectric 12, and the epoxy adhesive agent 70 is filled in the groove so as to seal the discharge space 13. In FIG. 29, the groove is provided in the dielectric 12. In FIG. 30, the outside edge of the ridge 8 is chamfered, and the epoxy adhesive agent 70 is filled in a triangular groove formed between the ridge 8 and the dielectric 12. In FIG. 31, the chamfering is performed at outside edge of the dielectric 12. Thus, as the adhesive agent is filled in the groove, etc., the adhesive agent is not forced out into the discharge space 13, and there is no fear that the adhesive agent may emit impure gas exposed to the discharge. In the above embodiments, the case of the ridge with groove is explained, but as shown in FIG. 32, a groove is provided in the dielectric 12, the upper surface of the ridge is the conductor wall 11, and a contact portion where the dielectrics 12 and the ridge 8 are contacted with each other may be bonded and sealed by the epoxy adhesive agent. In this case, similar effect as in the above embodiments can be obtained.

Furthermore, in place of the epoxy adhesive agent 70, a metal seal such as brazing may be applied, and similar effects can be obtained also in this case.

Figure 33:
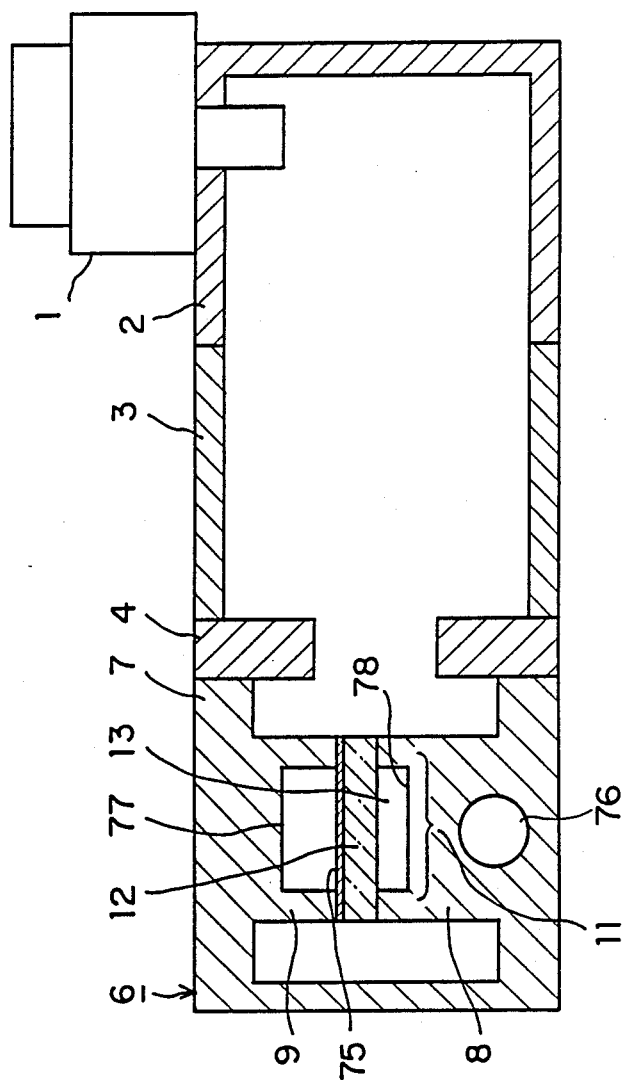
FIG. 33 is a sectional view of a gas laser apparatus as a ninth embodiment.

FIG. 33 shows a ninth embodiment where heat of the laser discharge tube can be removed efficiently. In FIG. 33, parts common to those in FIG. 7 of the first embodiment are designated by the same reference numerals. In FIG. 33, numeral 75 designates a metallized layer provided on surface of the dielectric 12 at the side opposite to the discharge space 13, and the metallized layer 75 is formed, for example, by an aluminium evaporation layer and connected integrally to the dielectric 12. Numerals 76, 77 designate cooling water paths formed respectively on the ridges 8 and 9, and the cooling water path 76 has circular cross-section and the cooling water path 77 has rectangular cross-section. The surface of the metallized layer 75 faces directly to the cooling water path 77, and the dielectric 12 is contacted directly by the cooling water through the metallized layer 75 and cooled. Numeral 78 designates a groove.

Operation in laser excitation of this embodiment is the same as that already described. The metallized layer 75 is installed integrally in close contact with the surface of the dielectric 12 at the side opposite to the discharge space 13 as above described, and the metallized layer 75 faces the cooling water path 77 and is contacted directly by the cooling water. Thereby the dielectric 12 is directly cooled and the plasma generating medium such as $CO_2$ laser gas in the discharge space 13 can be cooled efficiently. The temperature rise of the $CO_2$ laser gas or the like which may cause saturation of the laser output is prevented, and a plasma apparatus with high efficiency and large output, for example, a $CO_2$ gas laser apparatus, can be provided. Also in this case, the microwave can be absorbed by the cooling water, and escape of the microwave to outside can be prevented.

According to the invention as above described, since the cooling water in the cooling water path is contacted directly to the metallized layer provided integrally on the dielectric, temperature rise of the $CO_2$ laser gas can be suppressed effectively and saturation of the laser output can be prevented. Therefore, the apparatus can be operated with high efficiency even at high discharge power density.

Figure 34:
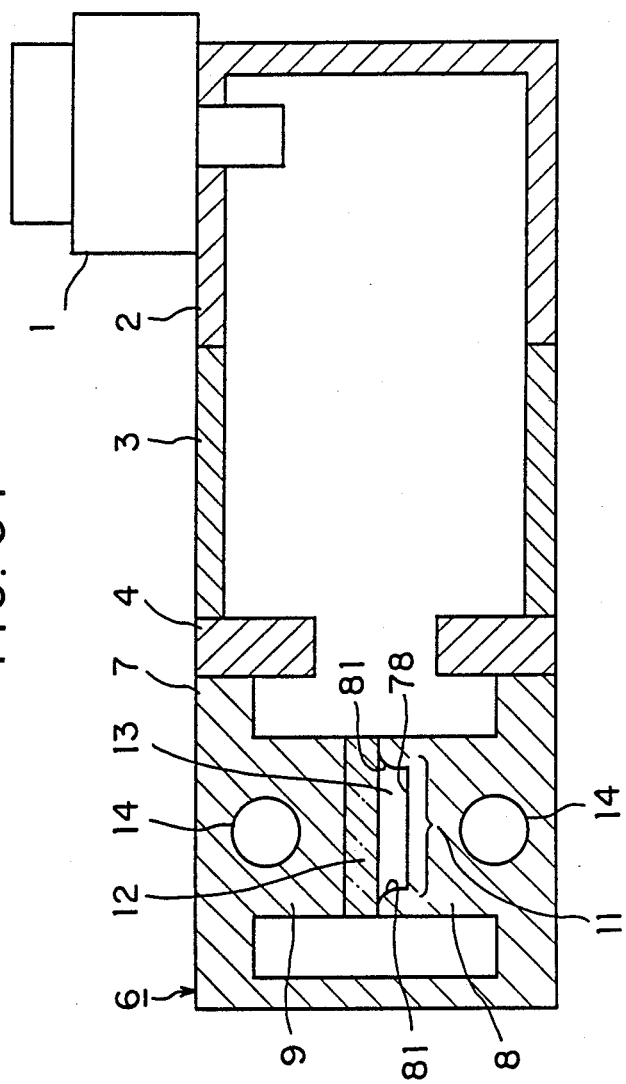
FIG. 34 is a sectional view of a gas laser apparatus as a tenth embodiment.
Figure 35:
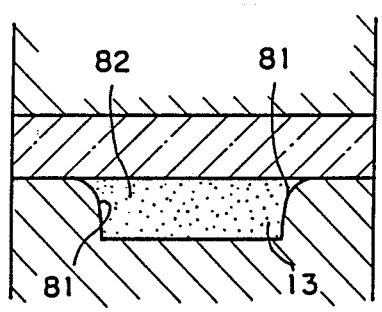
FIG. 35 is a detailed view of a main part of FIG. 34.

FIG. 34 and FIG. 35 show a tenth embodiment where generation of uneven plasma can be prevented more effectively. FIG. 34 shows the same apparatus as the gas laser apparatus shown in FIG. 7. In FIG. 34, numeral 81 designates an opening edge of a groove 78 constituting the discharge space 13. The opening edge 81 as shown also in FIG. 35 has a smooth arc-shaped surface so that concentration of the electric field to this portion is prevented.

Consequently, when the plasma is generated and the laser medium is excited, since the opening edge 81 of the groove 78 constituting the discharge space 13 has the smooth arc-shaped surface as shown in FIG. 35, there is no edge portion to cause concentration of the electric field to the conductor wall 11, and uneven plasma due to the concentration of the electric field can be prevented. That is, according to the arc-shaped surface as shown in FIG. 35, generation of a uniform microwave discharge plasma 82 in the discharge space 13 is facilitated, the discharge as a whole is made suitable for laser excitation, the laser resonance mode and the plasma are overlapped well, and a laser output operation with high efficiency and large output becomes possible.

Figure 37:
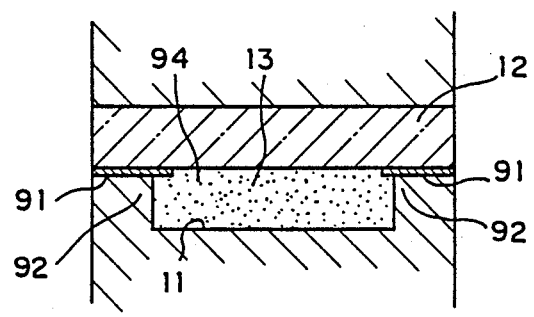
FIG. 37 is a detailed view of a main part of FIG. 36.
Figure 36:
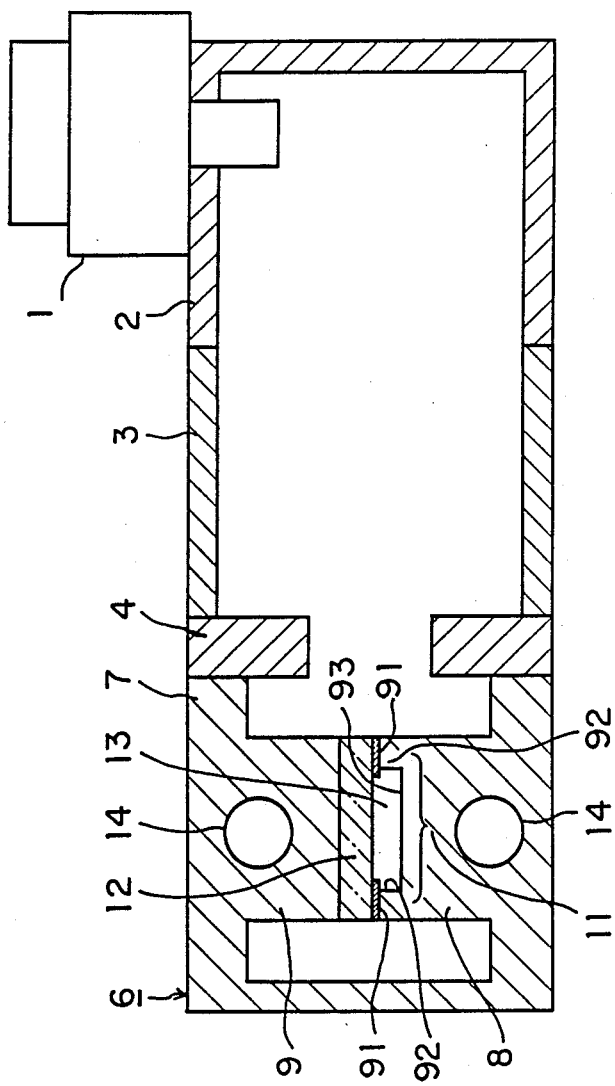
FIG. 36 is a sectional view of a gas laser apparatus as an eleventh embodiment.
Figure 38:
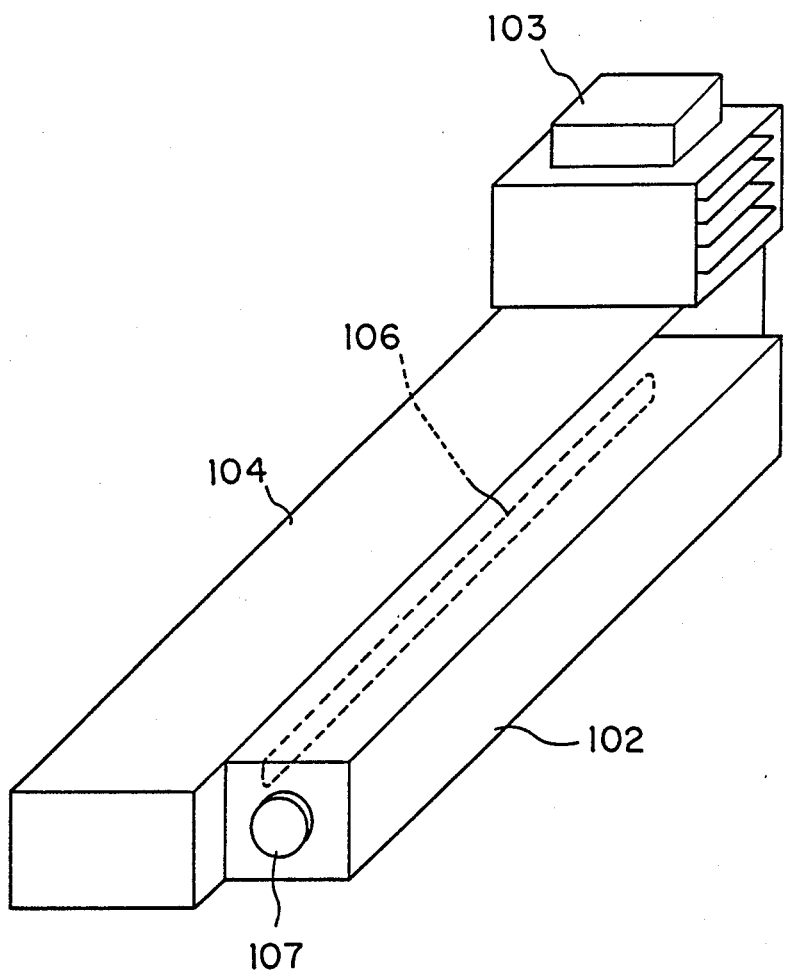
FIG. 38 is a view showing the appearance of a gas laser apparatus as a twelfth embodiment.
Figure 39:
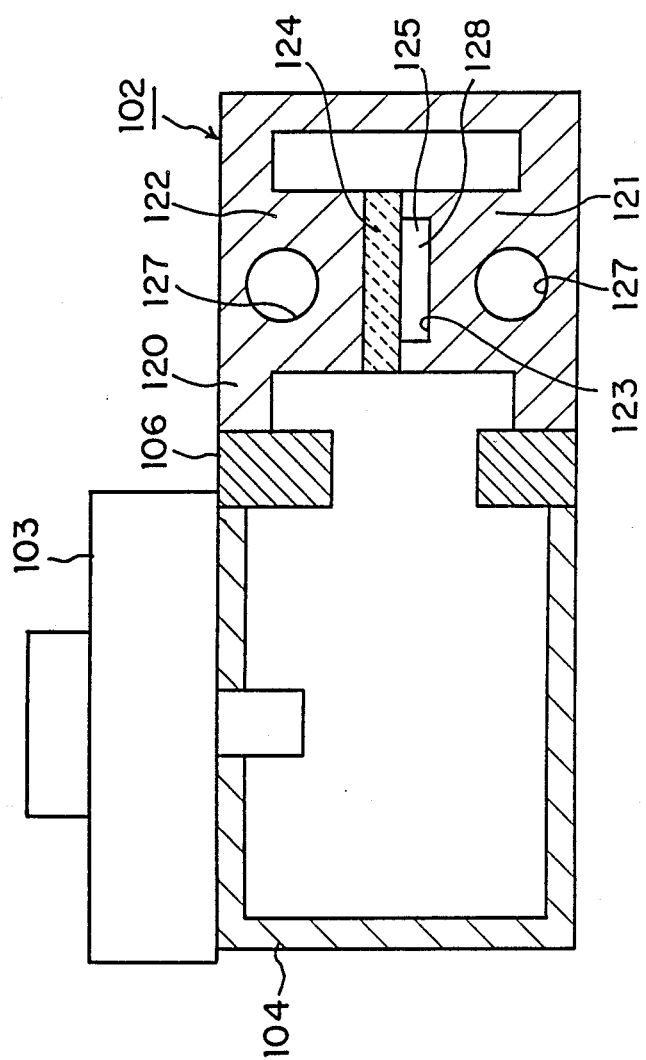
FIG. 39 is a sectional view of FIG. 38.

FIG. 36 and FIG. 37 show an eleventh embodiment as a modification of the tenth embodiment hereinbefore described in connection with FIG. 34 and FIG. 35. In FIG. 36, numeral 91 designates a metallized layer, for example, an aluminium evaporation layer, which is provided integrally with a portion on the dielectric 12 to cover an opening edge portion 92 of the discharge space as clearly seen in FIG. 37. The metallized layer 91 acts to shield the electric field of the microwave so that concentration of the electric field to the opening edge portion 92 is prevented.

Since the metallized layer 91 is provided on a portion of the dielectric 12 to cover the opening edge portion 92 of a groove 93 to form the discharge space 13, the electric field of the microwave can be shielded although it may be concentrated to the opening edge portion 92 without the metallized layer 91. Consequently, uneven plasma due to the concentration of the electric field can be prevented. Thus generation of the uniform microwave discharge plasma 94 in the discharge space 13 is facilitated, the discharge as a whole is made suitable for laser excitation, the laser resonance mode and the plasma are overlapped well, and a laser output operation with high efficiency and large output becomes possible.

FIGS. 38 through 41 show still other embodiments. In a gas laser apparatus as a twelfth embodiment shown in FIG. 38 and FIG. 39, numeral 102 designates a laser head section having a microwave cavity structure of the ridge waveguide type, numeral 103 designates a magnetron, numeral 104 designates a waveguide, numeral 106 designates a microwave coupling window which couples the waveguide 104 to the laser head section 102, and numeral 107 designates a reflection mirror for laser oscillation which is mounted on the laser head section 102. Also numeral 120 designates a cavity wall following the microwave coupling window 106 in the laser head section 102, numerals 121 and 122 designate ridges provided on a center portion of the cavity wall 120 and constituting a part of the microwave circuit, and numeral 123 designates a conductor wall formed on one ridge 121, and in the embodiment a bottom wall surface of a groove 128 provided on an upper surface of the ridge 121 is used as the conductor wall 123. Numeral 124 designates a dielectric, for example, alumina, which is installed opposite to the conductor wall 123 and acts as an incident window of microwave, and numeral 125 designates a discharge space which is formed between the conductor wall 123 and the dielectric 124 when the dielectric 124 covers the groove 128 on the upper surface of the ridge 121 and in which the laser gas such as $CO_2$ is filled.

Laser operation of the embodiment is the same as that described in FIG. 7. In the embodiment, the laser head section 102 which is the microwave circuit and the waveguide 104 which is the microwave transmission path are arranged in a parallel in direction along the laser optical axis, and the microwave is supplied through the lengthy microwave coupling window 106 provided in the longitudinal direction of the laser head section 102. Thereby a strong microwave electromagnetic field can be generated uniformly throughout the whole ridges 121, 122 of the laser head section 102. Consequently, the whole apparatus need not be made large but the long and uniform discharge can be obtained in the laser optical axis and an optimum state for the whole discharge and laser excitation is realized.

Figure 40:
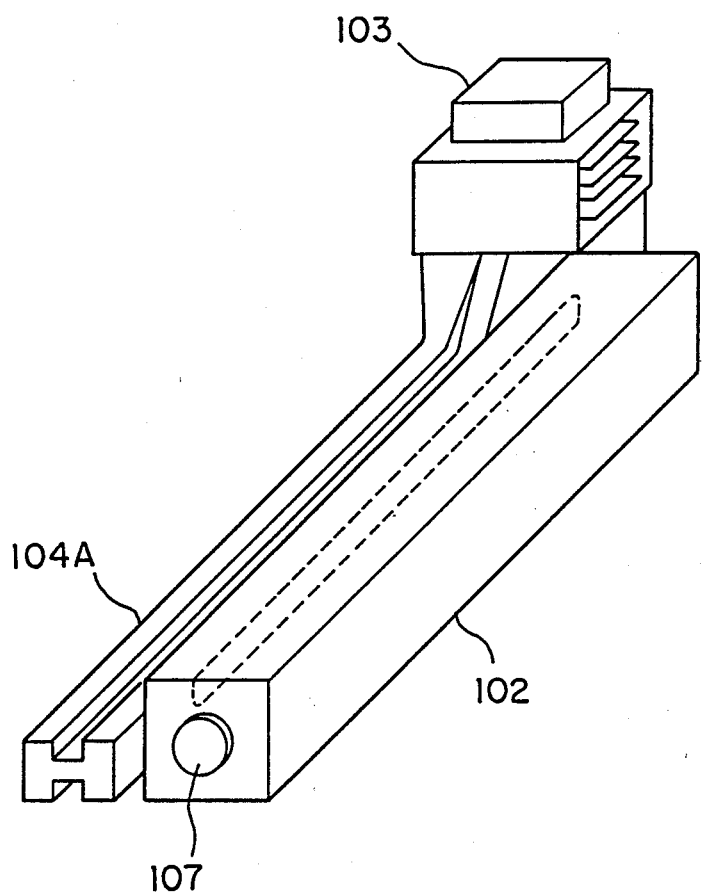
FIG. 40 is a view showing the appearance of a gas laser apparatus as a thirteenth embodiment.

FIG. 40 shows a thirteenth embodiment as a modification of the above-mentioned embodiment. In a gas laser apparatus of this embodiment, in order to avoid a state that the waveguide 104 is made of square cross-section and therefore becomes large for the microwave transmission, the waveguide as the microwave transmission path is made a ridge waveguide 104A. Thereby the microwave transmission path can be miniaturized and the whole configuration of the gas laser apparatus is reduced to small size and the installation occupied space can be reduced.

Figure 41:
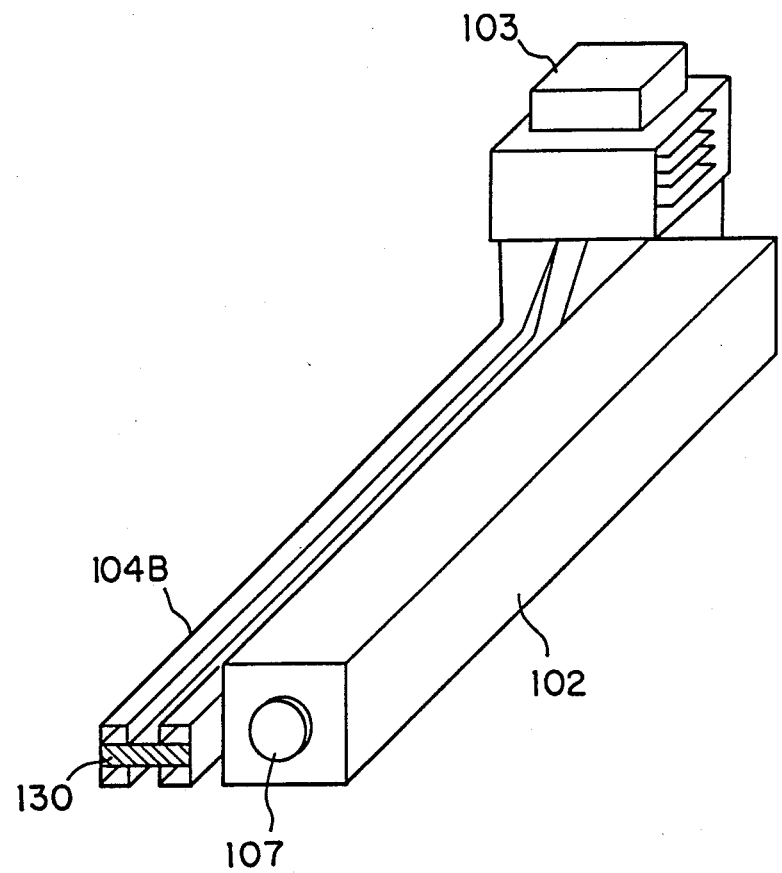
FIG. 41 is a view showing the appearance of a gas laser apparatus as a fourteenth embodiment.

FIG. 41 shows further a fourteenth embodiment of the invention. In this embodiment, a delay waveguide 104B being a delay transmission path is used as a waveguide, and a dielectric plate 130 as delay medium is internally installed. That is, the wavelength of the microwave passing through dielectric in the microwave circuit is shorter than the value in the case of passing through a vacuum. On the other hand, the wavelength of the microwave passing through the microwave transmission path such as an ordinary waveguide is longer than the value in the case of passing through the vacuum. Consequently, wavelength in each tube of the waveguide as the microwave transmission path and the microwave circuit is not coincident. Thereby it is difficult to perform the long and uniform discharge in the laser optical axis direction stably. In this embodiment, in order to solve inconsistency of the wavelength, the microwave transmission path is made a delay waveguide 104B having a dielectric plate 130. Thereby two microwave modes are coincident and a stable and uniform discharge and the laser output operation can be realized.

In this embodiment, although the microwave coupling window 106 (shown in FIG. 38) is of lengthy slit form, plural holes may be arranged in the laser optical axis direction. In this case, if the size of the holes is gradually decreased in three directions of the magnetron, that is, if the energy density distribution of the microwave is arbitrarily adjusted, the microwave can be uniformly distributed throughout the whole length of the ridges 121, 122, and uniform discharge in the discharge space 125 can be realized stably, and laser output with high efficiency becomes possible. In this embodiment, although the energy density distribution of the microwave and the impedance matching are adjusted simultaneously by the above-mentioned slit or holes, an element for impedance matching may be separately installed and such slit or holes may be installed in the other member without impedance matching.

According to the invention as above described, since laser gas generating plasma by microwave discharge is filled in the discharge space formed between a conductor wall formed in a part of the microwave circuit and a dielectric installed opposite to the conductor wall, and microwave mode having an electric field component orthogonal to the boundary between the dielectric and the plasma is formed by the microwave circuit, current penetrating between the dielectric and the conductor wall can flow substantially uniformly within the plasma. Thereby a plasma which is uniform in space is generated and a laser output can be obtained at high efficiency and large output. Moreover, since the microwave circuit and the microwave transmission path are arranged in parallel in the laser optical axis direction, a long and uniform discharge in the laser optical axis direction becomes possible, and a more stable and uniform plasma can be generated in the discharge space, and further the gas laser apparatus can be miniaturized.

What is claimed is:

1. A gas laser comprising a laser resonant cavity having a plasma discharge space formed therein and including a laser optical axis extending therein, a source of microwave energy including a microwave oscillator, and a microwave transmission path connecting said source of microwave energy to said plasma discharge space for providing microwave excitation to a plasma generating medium in said plasma discharge space, said plasma discharge space comprising a conductor wall forming a part of the plasma discharge space and a dielectric positioned opposite to the conductor wall to form together with said conductor wall and within said plasma discharge space a microwave excitation mode having an electric field component orthogonal to the boundary between the dielectric and the plasma excited in said plasma discharge space by the microwave energy.

2. A gas laser as set forth in claim 1, wherein the plasma discharge space comprises a microwave cavity.

3. A gas laser as set forth in claim 1, wherein the plasma discharge space comprises a coaxial line or a strip line.

4. A gas laser as set forth in claim 1, wherein the plasma discharge space comprises a surface wave line.

5. A gas laser as set forth in claim 1, including a projection extending inwardly in the region of said plasma discharge space to provide a strong electromagnetic field portion by concentration of the electromagnetic field produced by the projection.

6. A gas laser as set forth in claim 1, wherein at least a part of the microwave transmission path comprises a horn waveguide.

7. A gas laser as set forth in claim 1, wherein the plasma generating medium is $CO_2$ laser gas.

8. A gas laser as set forth in claim 1, wherein the plasma generating medium is excimer laser gas.

9. A gas laser as set forth in claim 1, wherein a groove is formed in the conductor wall to constitute a part of the plasma discharge space, and the plasma generating medium is filled in a space formed by covering an opening portion of the groove using the dielectric as an incident window of microwave.

10. A gas laser as set forth in claim 9, wherein the dielectric and the conductor are contacted in a plane.

11. A gas laser as set forth in claim 9, wherein the plasma discharge space has a ridge and the groove is formed on the ridge.

12. A gas laser as set forth in claim 9, wherein the plasma discharge space is a rectangular cavity.

13. A gas laser as set forth in claim 1, wherein the source of microwave energy is an apparatus to excite pulse microwave in the plasma discharge space.

14. A plasma apparatus as set forth in claim 13, wherein the pulse microwave has frequency 500 Hz or more.

15. A gas laser as set forth in claim 13, wherein said pulse microwave generating means is a microvace oscillator driven by a power source to generate high voltage in ripple by a half-wave voltage multiplying circuit.

16. A gas laser as set forth in claim 13, wherein the pulse microwave is generated by the microwave oscillator being driven by a high-voltage pulse source where DC of high voltage is interrupted by a switching element.

17. A gas laser as set forth in claim 13, wherein the pulse microwave exciting means has quiescent time less than thermal time constant of the plasma generating medium.

18. A gas laser as set forth in claim 16, wherein the pulse source to suply pulse voltage to the microwave oscillator is a power source apparatus to drive a non-linear element or device where current does not flow at voltage less than the prescribed voltage $E_z$ and current flows at the prescribed voltage $E_z$ or more, and a semiconductor switching element to control power flowing from voltage source to the non-linear element or device is connected in series with the non-linear element or device.

19. A gas laser as set forth in claim 18, wherein the non-linear element or device is provided with dividing resistors connected in parallel.

20. A gas laser as set forth in claim 18 or claim 19, wherein the semiconductor switching element has a withstand voltage lower than a voltage $E_o$ of the voltage source and higher than $E_o - E_z$.

21. A gas laser as set forth in claims 18 or 19, wherein plural semiconductor switching elements are connected in series.

22. A gas laser as set forth in claims 18 or 19, wherein the semiconductor switching element is a field effect transistor.

23. A gas laser as set forth in claims 18 or 19, wherein the semiconductor switching element is a bipolar transistor.

24. A gas laser as set forth in claims 18 or 19, wherein the non-linear element is a magnetron.

25. A gas laser as set forth in claim 1, wherein the conductor wall in the space is coated by a ceramic layer.

26. A gas laser as set forth in claim 25, wherein the thickness of the ceramic layer is 1/10 of that of the dielectric or less.

27. A gas laser as set forth in claim 25, wherein the thickness of the ceramic layer divided by its dielectric constant is less than the resistivity of the plasma divided by the surge impedance of a vacuum.

28. A gas laser as set forth in claim 25, wherein the ceramic layer comprises a material which does not react with halogen.

29. A gas laser as set forth in claim 1, wherein a reservoir tank communicates with the space by a connection penetrating hole and stores the plasma generating medium to be replaced for the plasma generating medium in the space.

30. A gas laser as set forth in claim 29, wherein the connection penetrating hole is provided with a gas permeable member which reflects the microwave.

31. A gas laser as set forth in claim 29, wherein the reservoir tank is installed in said conductor wall.

32. A gas laser as set forth in claim 1, wherein a recess comprising a first conductor wall to constitute a part of the plasma discharge space as a bottom surface and a second conductor wall as a side surface is installed, an opening portion of the recess is covered by a first dielectric body being an incident window of the microwave, a second dielectric body is arranged on the second conductor wall, the plasma generating medium is filled in a space formed by the first conductor wall, the first dielectric body and the second dielectric body, and the plasma discharge space forms a microwave mode having the electric field component orthogonal to the boundary between the first dielectric body and the plasma generated in the plasma producing medium.

33. A gas laser as set forth in claim 1, the space formed between the conductor wall and the dielectric acts as a light waveguide path, laser gas is filled in the space, the microwave is entered using the dielectric as a microwave incident window, and microwave mode having the electric field component orthogonal to the boundary between the dielectric and the plasma generated is formed whereby a light waveguide path type gas laser apparatus is constituted.

34. A gas laser as set forth in claim 1, wherein a part of the space other than the dielectric is made a gas permeable member to reflect the microwave, and in the space is circulated by circulation means through the gas permeable member.

35. A gas laser as set forth in claim 34, wherein the gas permeable member comprises a conductive member with a number of small holes bored thereon.

36. A gas laser as set forth in claim 34, wherein the gas permeable member comprises a honeycomb structure of metal.

37. A gas laser as set forth in claim 34, wherein the gas permeable member is a metal mesh.

38. A gas laser as set forth in claim 1, including a contact portion where the dielectric and a part of the plasma discharge space with the conductor wall formed thereon are contacted to each other, and wherein a part or the whole of the contact portion is bonded and sealed by epoxy adhesive agent.

39. A gas laser as set forth in claim 1, including a contact portion where the dielectric and a part of the plasma discharge space with the conductor wall formed thereon are contacted to each other, and wherein a part or the whole of the contact portion is subjected to metallizing and a portion of the plasma discharge space is subjected to a metal seal.

40. A gas laser as set forth in claim 1, wherein a metallized layer is provided on a surface of the dielectric on the side opposite to the space, and the other surface of the metallized layer faces directly to a cooling water path provided in the conductor wall.

41. A gas laser as set forth in claim 1, wherein a groove forms part of the space and an opening edge of the groove is made arc-shape.

42. A gas laser as set forth in claim 1, wherein a groove forms part of the space and a metallized layer covering an opening edge portion of the groove is provided on a part of the dielectric.

43. A gas laser as set forth in claim 42, wherein the metallized layer is an aluminium layer produced by evaporation.

44. A gas laser as set forth in claim 1, wherein said plasma apparatus provides a laser optical axis and the microwave transmission path and the plasma discharge space are arranged in parallel along the laser optical axis.

45. A gas laser as set forth in claim 44, wherein the microwave transmission path is a square transmission path.

46. A gas laser as set forth in claim 44, wherein the microwave transmission path is a ridge waveguide.

47. A gas laser as set forth in claim 44, wherein the microwave transmission path is a delay transmission path.

48. A gas laser as set forth in claim 43, wherein the microwave transmission path and the plasma discharge space are coupled through a slit.

49. A gas laser as set forth in claim 43, wherein the microwave transmission path and the plasma discharge space are coupled through a plurality of holes.

* * * * *

UNITED STATES PATENT AND TRADEMARK OFFICE
CERTIFICATE OF CORRECTION

PATENT NO. : 4,890,294

DATED : December 26, 1989

INVENTOR(S) : JUNICHI NISHIMAE ET AL.

It is certified that error appears in the above-identified patent and that said Letters Patent is hereby corrected as shown below:

TITLE PAGE: Col. 1, [30], line 9, "225208" should be --62-225208--;
line 10, "225209" should be --62-225209--;
line 18, "62-225222" should be --62-225224--.

Col. 1, line 68, "perpendicular becomes" should be --becomes perpendicular--.

*Col. 2, line 41, "a" (second occurrence) should be --an--.

Col. 6, line 40, delete "a".

Col. 8, line 46, ";" (both occurrences) should be --,-- (both occurrences).

*Col. 10, line 7, "FIG." should be --FIGS.--;
* line 31, "FIG." should be --FIGS.--.

Col. 16, line 46, "be" should be --become--.

Col. 17, line 7, "dielectric, thereby" should be --dielectric. Thereby--.

Col. 18, line 17, delete "the" (second occurrence).

Col. 22, line 49, "Thereby" should be --Therefore--.

UNITED STATES PATENT AND TRADEMARK OFFICE
CERTIFICATE OF CORRECTION

PATENT NO. : 4,890,294

DATED : December 26, 1989

INVENTOR(S) : JUNICHI NISHIMAE ET AL.

It is certified that error appears in the above-identified patent and that said Letters Patent is hereby corrected as shown below:

*Col. 24, line 11, "plasma apparatus" should be --gas laser--;
Col. 24, line 15, "microvace" should be --microwave--;
    line 68, "with halogen" should be --with a halogen layer--;
Col. 25, line 26, after "1," insert --wherein--;
    line 38, after "and" insert --plasma--.

Signed and Sealed this

Third Day of December, 1991

Attest:

HARRY F. MANBECK, JR.

Attesting Officer

Commissioner of Patents and Trademarks